(12) United States Patent
Aoyagi et al.

(10) Patent No.: US 9,134,346 B2
(45) Date of Patent: Sep. 15, 2015

(54) METHOD OF MAKING CONTACT PROBE

(75) Inventors: Masahiro Aoyagi, Tsukuba (JP);
Katsuya Kikuchi, Tsukuba (JP);
Hiroshi Nakagawa, Tsukuba (JP);
Yoshikuni Okada, Tsukuba (JP);
Hiroyuki Fujita, Kawasaki (JP);
Shouichi Imai, Kawasaki (JP); Shigeo Kiyota, Tokyo (JP)

(73) Assignees: NATIONAL INSTITUTE OF ADVANCED INDUSTRIAL SCIENCE AND TECHNOLOGY, Tokyo (JP); KIYOTO MANUFACTURING CO., Tokyo (JP)

( * ) Notice: Subject to any disclaimer, the term of this patent is extended or adjusted under 35 U.S.C. 154(b) by 1103 days.

(21) Appl. No.: 13/168,136

(22) Filed: Jun. 24, 2011

(65) Prior Publication Data

US 2011/0247209 A1 Oct. 13, 2011

Related U.S. Application Data

(62) Division of application No. 12/297,732, filed as application No. PCT/JP2007/058561 on Apr. 19, 2007, now Pat. No. 7,990,165.

(30) Foreign Application Priority Data

Apr. 21, 2006 (JP) ................................. 2006-117440

(51) Int. Cl.
*H01R 43/00* (2006.01)
*G01R 3/00* (2006.01)
(Continued)

(52) U.S. Cl.
CPC .............. *G01R 3/00* (2013.01); *G01R 1/06772* (2013.01); *G01R 1/07342* (2013.01); *Y10T 29/49117* (2015.01); *Y10T 29/49126* (2015.01); *Y10T 156/10* (2015.01)

(58) Field of Classification Search
CPC . G01R 1/06772; G01R 3/00; Y10T 29/49117

USPC ........ 29/825, 830–832, 868, 592.1, 874, 884, 29/885; 324/754.03, 761
See application file for complete search history.

(56) References Cited

U.S. PATENT DOCUMENTS

| 4,851,767 A | 7/1989 | Halbout et al. |
| 5,506,515 A | 4/1996 | Godshalk et al. |

(Continued)

FOREIGN PATENT DOCUMENTS

| JP | 64-021309 U | 2/1989 |
| JP | 2000-241444 A | 9/2000 |

(Continued)

OTHER PUBLICATIONS

International Search Report of PCT/JP2007/058561, mailing date of Jul. 17, 2007.

(Continued)

*Primary Examiner* — Minh Trinh
(74) *Attorney, Agent, or Firm* — Westerman, Hattori, Daniels & Adrian, LLP

(57) ABSTRACT

A method of making a contact probe including a step of making a first printed wiring board having a signal electrode and a ground electrode used as a contact part of the contact probe with respect to a measuring object, in which the signal electrode and ground electrode are formed of a metal wiring pattern, and making a second printed wiring board with a coaxial line structure having a shield electrode which encloses a signal line and the surroundings of the signal line through an insulating layer. The signal electrode of the first printed wiring board and the signal line of the second printed wiring board are electrically connected together, and the ground electrode of the first printed wiring board and the shield electrode of the second printed wiring board are electrically connected together.

15 Claims, 32 Drawing Sheets

(51) Int. Cl.
    *G01R 1/067*     (2006.01)
    *G01R 1/073*     (2006.01)

(56) References Cited

U.S. PATENT DOCUMENTS

| | | | |
|---|---|---|---|
| 5,748,006 | A | 5/1998 | Sano |
| 6,242,930 | B1 | 6/2001 | Matsunaga et al. |
| 6,281,691 | B1 | 8/2001 | Matsunaga et al. |
| 6,310,483 | B1 | 10/2001 | Taura et al. |
| 6,400,168 | B2 | 6/2002 | Matsunaga et al. |
| 6,486,688 | B2 | 11/2002 | Taura et al. |
| 6,788,966 | B2 * | 9/2004 | Kenan et al. .................. 600/372 |
| 6,903,563 | B2 * | 6/2005 | Yoshida et al. .......... 324/754.07 |
| 7,015,710 | B2 * | 3/2006 | Yoshida et al. .......... 324/755.09 |
| 7,208,966 | B2 | 4/2007 | Aoyagi et al. |
| 7,227,352 | B2 | 6/2007 | Aoyagi et al. |
| 7,293,996 | B2 * | 11/2007 | Van Schuylenbergh et al. .............................. 439/66 |
| 7,332,923 | B2 | 2/2008 | Schott et al. |
| 7,990,165 | B2 * | 8/2011 | Aoyagi et al. ........... 324/754.03 |
| 8,671,567 | B2 * | 3/2014 | Hirakawa et al. ................ 29/885 |
| 2001/0038294 | A1 | 11/2001 | Matsunaga et al. |
| 2005/0264313 | A1 | 12/2005 | Aoyagi et al. |
| 2006/0071677 | A1 | 4/2006 | Feigenbaum et al. |
| 2007/0065956 | A1 | 3/2007 | Aoyagi et al. |

FOREIGN PATENT DOCUMENTS

| | | |
|---|---|---|
| JP | 2001-133482 A | 5/2001 |
| JP | 2002-325001 A | 11/2002 |
| JP | 2003-84010 A | 3/2003 |
| JP | 2006-010678 A | 1/2006 |
| JP | 2006-024618 A | 1/2006 |

OTHER PUBLICATIONS

European Search Report dated Oct. 29, 2012, issued in corresponding European Patent Application No. 07741997.6.

* cited by examiner

METHOD OF MAKING CONTACT PROBE

CROSS-RELATED APPLICATIONS

This application is a divisional of U.S. application Ser. No. 12/297,732, filed Feb. 10, 2009 now U.S. Pat. No. 7,990,165, issued Aug. 2, 2011, which is a 371 of PCT/JP2007/058561, filed Apr. 19, 2007, claiming the benefit of JP2006-117440 filed Apr. 21, 2006.

TECHNICAL FIELD

The present invention relates to a contact probe and a method of making the same which are used for measuring a high frequency characteristic of a semiconductor integrated circuit, a package for a semiconductor integrated circuit, a printed circuit board, etc., especially correspond to a plurality of channel signals.

BACKGROUND ART

Recently, as an electric apparatus has been faster and of a higher frequency, there has been an increasing need, compared with conventional ones, to measure and inspect electrical characteristics with respect to a high speed and a high frequency signal of an electronic device, an electronic component, a mounting component, etc. which constitute an apparatus. A high frequency contact probe is used in the case of such measurement and inspection. The conventional high frequency contact probe is predominantly arranged such that a fine metal contact pad is connected to a tip of a thin-line rigid coaxial cable. As a product, the high frequency contact probes from GGB Industries, Inc., Cascade Microtech, Inc., and Suss MicroTec are widely used, for example.

However, there is a problem in that as for many of the contact probes used conventionally and widely, even a fine electrode pitch at the tip (interval between signal electrode and ground electrode) is approximately 100 μm, then it is difficult to evaluate characteristics of an interposer etc. for an integrated circuit having a fine pitch of less than 50 μm.

As a technology which solves such a problem, patent document 1 discloses a probe tip component which has the signal electrode and ground electrode brought into contact with a measuring object and is made from a printed circuit board, and the above-mentioned probe tip component is electrically connected to the tip of a coaxial cable by soldering.

According to the structure as disclosed in patent document 1, the electrode pitch of the probe tip component can be arranged to be less than 50 μm by way of a technology of manufacturing the printed wiring board, and even the measuring object with a fine pitch allows the high speed and the high frequency signal to be measured.

Patent document 1: Japanese Patent Application Publication (KOKAI) No. 2006-10678

DISCLOSURE OF THE INVENTION

Object of the Invention

However, in the contact probe as disclosed by patent document 1, there is a problem in that when connecting the coaxial cable, which is from a measurement apparatus, to the probe tip component directly, it is difficult to perform the connection exactly by soldering, since the probe tip component is very small.

Further, in the case where there are a plurality of measuring objects, if the pitch between the respective measuring objects is large, it is possible to measure it by means of a plurality of single-channel high-frequency probes as shown in patent document 1. However, in the case where the pitch between the respective measuring objects is small, use of the high frequency contact probes corresponding to a plurality of channel signals for a plurality of channels is indispensable.

However, in the case where the high frequency probe corresponding to a plurality of channels is constituted by the conventional single-channel high-frequency contact probes including the probes as disclosed in patent document 1, it is necessary to arrange a plurality of probe tips in a horizontal line, for example, and it is technically difficult to arrange a plurality of probes at a fine pitch of 50 μm or less.

The present invention arises in a situation as described above, and aims at providing a contact probe which can easily be connected with a measurement apparatus electrically, can measure a high speed and high frequency signal with a fine pitch easily and correctly, and can cope with signal measurement for a plurality of channels, and a method of making the contact probe.

Means to Solve the Problem

The contact probe in accordance with the present invention made in order to solve the above-mentioned problem is a contact probe used for measuring and evaluating the high speed and high frequency characteristic, the contact probe including a first printed wiring board having a signal electrode and a ground electrode used as a contact part with respect to a measuring object, in which the signal electrode and ground electrode are formed of a metal wiring pattern on a substrate, and a second printed wiring board with a coaxial line structure having a shield electrode which encloses a signal line and the surroundings of the signal line through an insulating layer, characterized in that the signal electrode of the above-mentioned first printed wiring board and the signal line of the above-mentioned second printed wiring board are electrically connected together, and the ground electrode of the above-mentioned first printed wiring board and the shield electrode of the above-mentioned second printed wiring board are electrically connected together. In addition, it is desirable that the electrode pitch between the above-mentioned signal electrode and the above-mentioned ground electrode is arranged to be equal to or greater than 10 μm or less than 50 μm.

By making the contact probe from the printed wiring board in this way, the probe tip part (first printed wiring board) having a fine (for example, less than 50 μm) electrode pitch can be easily formed with sufficient accuracy. Therefore, the probe tip can be pressed against fine pitch portions formed at a semiconductor integrated circuit, a package for the semiconductor integrated circuit, the printed circuit board, etc., and the high speed and high frequency measurement can be realized.

Further, since electrical connection between the first printed circuit board (probe tip part) and the measurement apparatus (coaxial cable) is achieved through the second printed circuit board which has a coaxial line structure, the connection can be performed easily and correctly. In particular, since the connection between the first printed circuit board to have a fine structure and the second printed circuit board is connection between the substrates, it can be performed through fine bumps etc. and it is possible to achieve easy and exact electric connection.

Further, since the second printed circuit board has the coaxial line structure, it is possible to improve transmission efficiency of the high speed and high frequency signal, and to reduce an incoming noise and a cross talk occurred between wirings.

Furthermore, since the first printed circuit board whose tip part is of a very fine structure and the second printed circuit board are electrically connected together through the fine bumps, it is possible to reduce a deviation of the characteristic impedance at the connection part and to improve the transmission characteristic greatly.

In addition, although it is possible to make the first printed circuit board and the second printed circuit board integrally on one printed circuit board, it is necessary to use "via connection" structure in that case. However, since the conventional "via connection" structure provides an insufficient high frequency characteristic, the present invention employs fine bump connection.

Further, in the above-mentioned second printed wiring board, it is desirable to form the ground line which is electrically connected to the above-mentioned shield electrode in the same plane as the above-mentioned signal line, and to form a cut-off portion so that a predetermined area of either upper or lower sides of the above-mentioned signal line and the above-mentioned ground line may be exposed.

In the second printed wiring board, by forming the cut-off portion in this way, the connection part connecting with the first printed wiring board is provided, and the connection can be achieved easily.

Further, it is desirable that a plurality of groups of signal electrodes and ground electrodes are formed in the above-mentioned first printed wiring board, corresponding groups of signal lines and shield electrodes are formed in the above-mentioned second printed wiring board, the signal electrodes of the above-mentioned first printed wiring board and the signal lines of the above-mentioned second printed wiring board are electrically connected together for each corresponding group, and the ground electrodes of the above-mentioned first printed wiring board and the shield electrodes of the above-mentioned second printed wiring board are electrically connected together for each corresponding group.

Thus, by forming a plurality of channels (plurality of groups) of electrodes by means of the printed wiring boards, it is possible to form and arrange the plurality of electrodes at the contact probe tip, in which the electrode pitch is fine (for example, less than 50 μm). Therefore, even in the case where the plurality of channels of measuring objects are located at a fine pitch, it is possible to measure the high speed and high frequency signal for each channel by the contact probe coping with the plurality of channels.

Further, by forming a shape of the second printed wiring board into the shape of a fan where a width of a rear end (connection side with coaxial cable) is gradually extended, it is possible to widen the pitch between the electrodes of adjoining channels at the rear end, and to easily achieve the connection with the coaxial cable which is from the measurement apparatus.

Further, the method of making the contact probe in accordance with the present invention made in order to solve the above-mentioned subject is a method of making a contact probe used for measuring and evaluating a high speed and high frequency characteristic, characterized by implementing a step of making a first printed wiring board in which a signal electrode and a ground electrode used as a contact part with respect to a measuring object are formed of a metal wiring pattern, and making a second printed wiring board with a coaxial line structure having a shield electrode which encloses a signal line and the surroundings of the above-mentioned signal line through an insulating layer, and a step of electrically connecting the signal line of the above-mentioned second multilayer printed wiring board to the signal electrode of the above-mentioned first printed wiring board, and electrically connecting the shield electrode of the above-mentioned second printed wiring board to the ground electrode of the above-mentioned first printed wiring board.

By way of such a method, it is possible to make the contact probe formed of the printed wiring board, and the probe tip of this contact probe can be pressed against the fine pitch portions formed at the semiconductor integrated circuit, the package for the semiconductor integrated circuit, the printed circuit board, etc., to realize the high speed and high frequency measurement.

Further, it is desirable that the plurality of groups of signal electrodes and ground electrodes are formed in the above-mentioned first printed wiring board, corresponding groups of signal lines and shield electrodes are formed in the above-mentioned second printed wiring board, the signal electrodes of the above-mentioned first printed wiring board and the signal lines of the above-mentioned second printed wiring board are electrically connected together for each corresponding group, and the ground electrodes of the above-mentioned first printed wiring board and the shield electrodes of the above-mentioned second printed wiring board are electrically connected together for each corresponding group.

In the case of the plurality of measuring objects, even if the pitch between the respective measuring objects is fine (for example, less than 50 μm), it is possible to make the corresponding plurality of channels (plurality groups) of contact probes, and to measure the high speed and high frequency signal for each channel by way of such a method.

In addition, the process of making the first printed wiring board and the second printed wiring board may employ a production method similar to a process of making a so-called silicon interposer. In this case, precision of fine line pattern forming is improved, and controllability of characteristic impedance of the lines is improved, to thereby improve the transmission characteristic.

Furthermore, in the step of making the above-mentioned first printed wiring board, it is desirable to perform a step of laminating a thin-film metal layer on a substrate made of silicon or glass, a step of laminating an insulating layer on the above-mentioned metal layer, a step of forming a photoresist pattern for forming the signal electrode and the ground electrode on the above-mentioned insulating layer, a step of laminating a metal layer on the insulating layer on which the above-mentioned photoresist pattern is formed, and a step of removing the above-mentioned photoresist pattern and forming the signal electrode and the ground electrode by the metal layer laminated on the above-mentioned insulating layer.

In addition, in the step of making the above-mentioned first printed wiring board, it is possible to perform a step of laminating a thin-film metal layer on a substrate made of silicon or glass, a step of laminating an insulating layer on the above-mentioned metal layer, a step of laminating a metal layer on the above-mentioned insulating layer, and a step of forming a metal wiring pattern to be the signal electrode and the ground electrode on an uppermost metal layer by etching.

Alternatively, in the step of making the above-mentioned first printed wiring board, it is possible to perform a step of forming, by etching, a metal wiring pattern to be the signal electrode and the ground electrode on the metal layer of either upper or lower side of the insulating layer whose both sides are joined with thin-film metal layers.

By performing such a step, it is possible to form a probe tip part (first printed wiring board) whose electrode pitch is fine (for example, less than 50 µm) easily and with sufficient accuracy.

Further, in the step of making the above-mentioned second printed wiring board, it is desirable to perform a step of laminating an insulated side of an insulating layer whose one side is joined with a metal layer, onto a metal layer of either upper or lower side of an insulating layer whose both sides are joined with a thin-film metal layer, a step of forming a metal wiring pattern to be the signal line and the ground line at an uppermost metal layer by etching, a step of laminating an insulating side of the insulating layer whose one side is joined with a metal layer, onto a side where the above-mentioned metal wiring pattern is formed, a step of carrying out a grooving process, respectively on both sides of the above-mentioned signal line along an extended direction of the above-mentioned signal line, towards a lower part from an upper part, intersecting the above-mentioned ground line, and reaching a metal layer lower than the above-mentioned signal line, a step of subjecting, at least, a portion subjected to the above-mentioned grooving process to a metal plating process to form the shield electrode which encloses the surroundings of the above-mentioned signal line through the insulating layer, and a step of performing a cutting process so that a predetermined area of either upper or lower sides of the above-mentioned signal line and ground line may be exposed respectively.

By performing such a step, it is possible to make the second circuit board having the coaxial line structure. Further, connection between the first printed wiring board and the coaxial cable from measurement apparatus is carried out through this second printed wiring board, and the connection with each of them is easily carried out.

In addition, it is desirable to use a prepreg including any of polyimide resin, BCB resin, polyamide resin, polyoxazole resin, epoxy resin, Teflon (registered trademark) resin, and cycloolefin resin for each of the above-mentioned insulating layers.

Further, it is desirable that the metal layer laminated to the above-mentioned insulating layer is formed of either gold, silver, or copper.

Furthermore, it is desirable that the metal plating carried out for the portion subjected to the above-mentioned grooving process is copper plating.

According to the present invention, the contact probe is provided which can easily be connected with the measurement apparatus electrically, can measure the high speed and high frequency signal with the fine pitch easily and correctly, and can cope with signal measurement for the plurality of channels, and the method of making the contact probe is provided.

DESCRIPTION OF REFERENCE SIGNS

Figure 1:
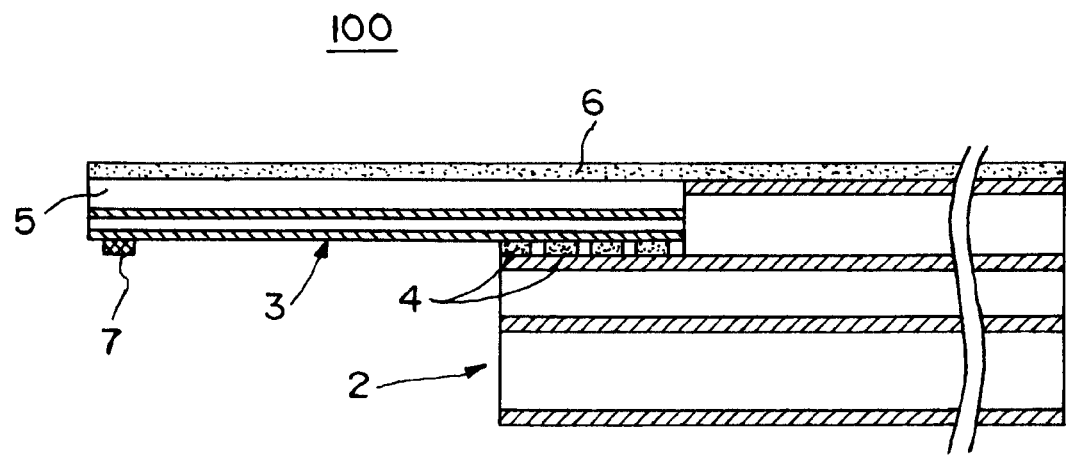
FIG. 1 is a side view showing a first preferred embodiment of a contact probe in accordance with the present invention.

2: probe main body (second printed wiring board)
2a: cut-off portion
3: probe tip part (first printed wiring board)
4: fine bumps
5: substrate
6: reinforcing board
7: contact bumps
8: insulating layer
9: metal layer
10: metal layer
10a: signal electrode
10b: ground electrode
11: insulating layer
12: metal layer
13: metal layer
14: insulating layer
15: metal layer
15a: signal line
15b: ground line
16: insulating layer
17: metal layer
18: metal plated layer
19: groove portion
20: probe main body (second printed wiring board)
30: probe tip part (first printed wiring board)
100: contact probe
101: contact probe

BEST MODE FOR IMPLEMENTING THE INVENTION

Figure 2:
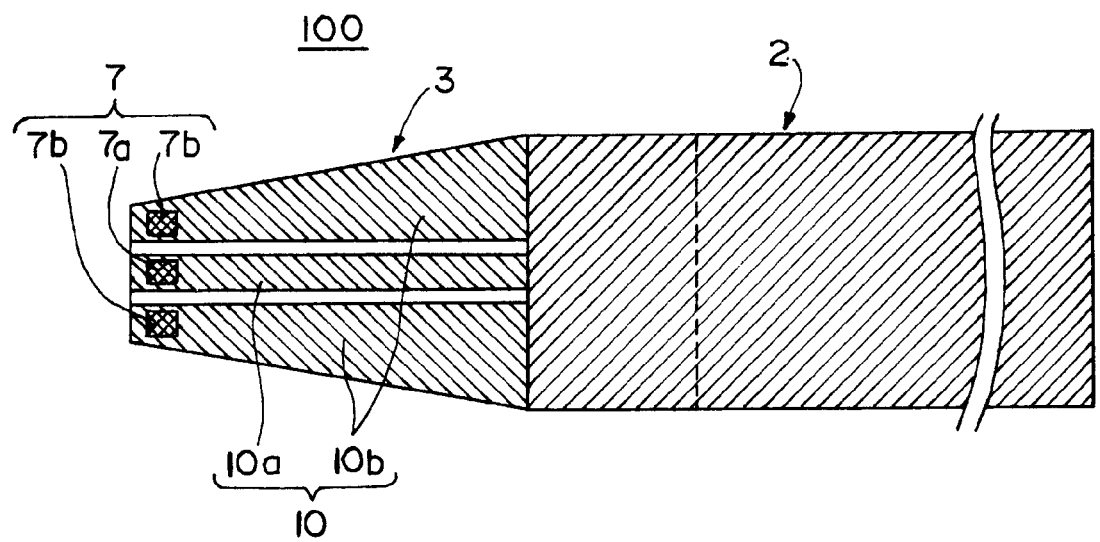
FIG. 2 is a bottom view of the contact probe in FIG. 1.

Hereafter, the preferred embodiments of a contact probe and a method of making the same in accordance with the present invention will be described with reference to the drawings. FIG. 1 is a side view showing a first preferred embodiment of a contact probe in accordance with the present invention. FIG. 2 is a bottom view of the contact probe in FIG.

1. In addition, the contact probe as shown in the first preferred embodiment is a probe with a structure corresponding to a single channel (single group).

As illustrated, a contact probe 100 has a probe tip part 3 used as a contact part coming into contact with a measuring object, and a probe main body 2 connected with a high frequency measurement apparatus through a coaxial cable etc. (not shown).

The probe tip part 3 (first printed wiring board) and the probe main body 2 (second printed wiring board) are respectively formed from printed wiring boards, which are mutually joined by thermocompression at 100° C. through 150° C. using fine bumps 4. In addition, it is preferable that the fine bumps 4 are formed of either gold, a gold alloy, silver, or a silver alloy.

Further, although the fine bumps are used, electric connection between the probe tip part 3 and the probe main body 2 may be carried out by pressure contact, without forming a junction by way of thermocompression. In this case, after applying thermosetting resin into a gap between the probe tip part 3 and the probe main body 2, they are brought into pressure contact with each other, and the hardening and shrinking by heating raises the contact pressure, thus being possible to secure the electric connection. Such a method is referred to as the NCP (Non Conductive Paste) process.

Further, since there is a possibility that the junction by means of the fine bumps 4 provides by itself insufficient strength as the probe, the substrate 5 made of silicon or glass is formed on the upper layer of the probe main body 2 as shown in FIG. 1, whereby the reinforcing board 6 made from a resin board, a metal plate, etc. is adhered to, with adhesives, upper surfaces of the probe main body 2 and the probe tip part 3 which are flattened.

In addition, in the case where the substrate 5 is formed of glass, transparency is acquired in the probe tip part 3 and visibility with respect to an electrode position is improved, thus positioning is easy when in contact with the measuring object. If this is the case, it is desirable that the reinforcing board is also formed of transparent resin etc.

Further, as described above, in the case where the electric connection between the probe tip part 3 and the probe main body 2 is realized by way of pressure contact, if the adhesive of the reinforcing board 6 and the resin sealed in the gap between the probe tip part 3 and the probe main body 2 are dissolved by a solvent, an acid, etc. as a remover then the probe tip part 3 can be replaced.

Further, as shown in FIG. 2, three lines (one signal electrode 10a and two ground electrodes 10b) are formed at a metal wiring pattern 10 beneath the probe tip part 3, and contact bumps 7 (one signal contact bump 7a and two grounding contact bumps 7b) for contacting the measuring object are formed at respective tips. That is, the signal contact bump 7a provided for the tip of central signal electrode 10a is a contact bump for picking up a signal from the measuring object. Further, the grounding contact bumps 7b provided for the tips of ground electrodes 10b on both sides are contact bumps for picking up a ground level signal on the measuring object side. In addition, the electrode pitch of the signal contact bump 7a and the grounding contact bumps 7b is set as 10 to 50 μm, for example.

Further, in the probe main body 2, the coaxial cable (not shown) may be connected with an opposite side (rear end side) of a side to which the probe tip part 3 is connected. By connecting the coaxial cable to the high frequency measurement apparatus etc., it is possible to measure a high frequency signal. In other words, according to this contact probe 100, since the probe tip part 3 is made from the printed wiring board, a desired electrode pitch of less than 50 μm (for example) can be formed easily, and it is possible to measure the fine pitch of the measuring object. Further, the probe main body 2 has the coaxial line structure as will be described in detail later, to thereby improve transmission efficiency of the high speed and high frequency signal, and to reduce an incoming noise and a cross talk occurred between wirings. In addition, a length in an extended direction of the coaxial line of the probe main body 2 is formed and set up arbitrarily.

Further, since the probe main body 2 is made from the printed wiring board having the coaxial line structure as described above, it is possible to facilitate the connection with the probe tip part 3, and the connection with the coaxial cable from the measurement apparatus respectively. In other words, the electric connection between the probe tip part 3 and the measurement apparatus can be achieved easily and correctly. Especially, since the connection between the probe tip part 3 to have a fine structure and the probe main body 2 is the connection between the substrates, it can be performed through the fine bumps 4 and it is possible to realize easy and exact electric connection.

Figure 3:
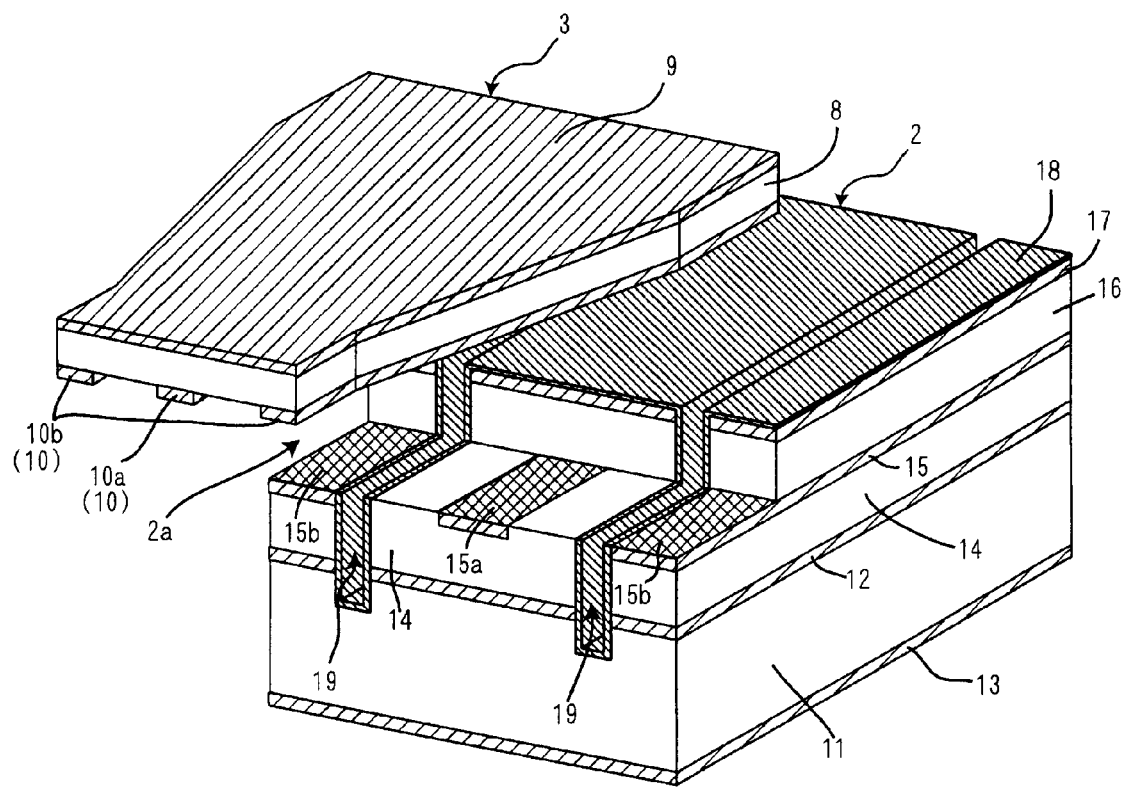
FIG. 3 is a perspective view from above of a probe main body and a probe tip part of the contact probe in FIG. 1.
Figure 4:
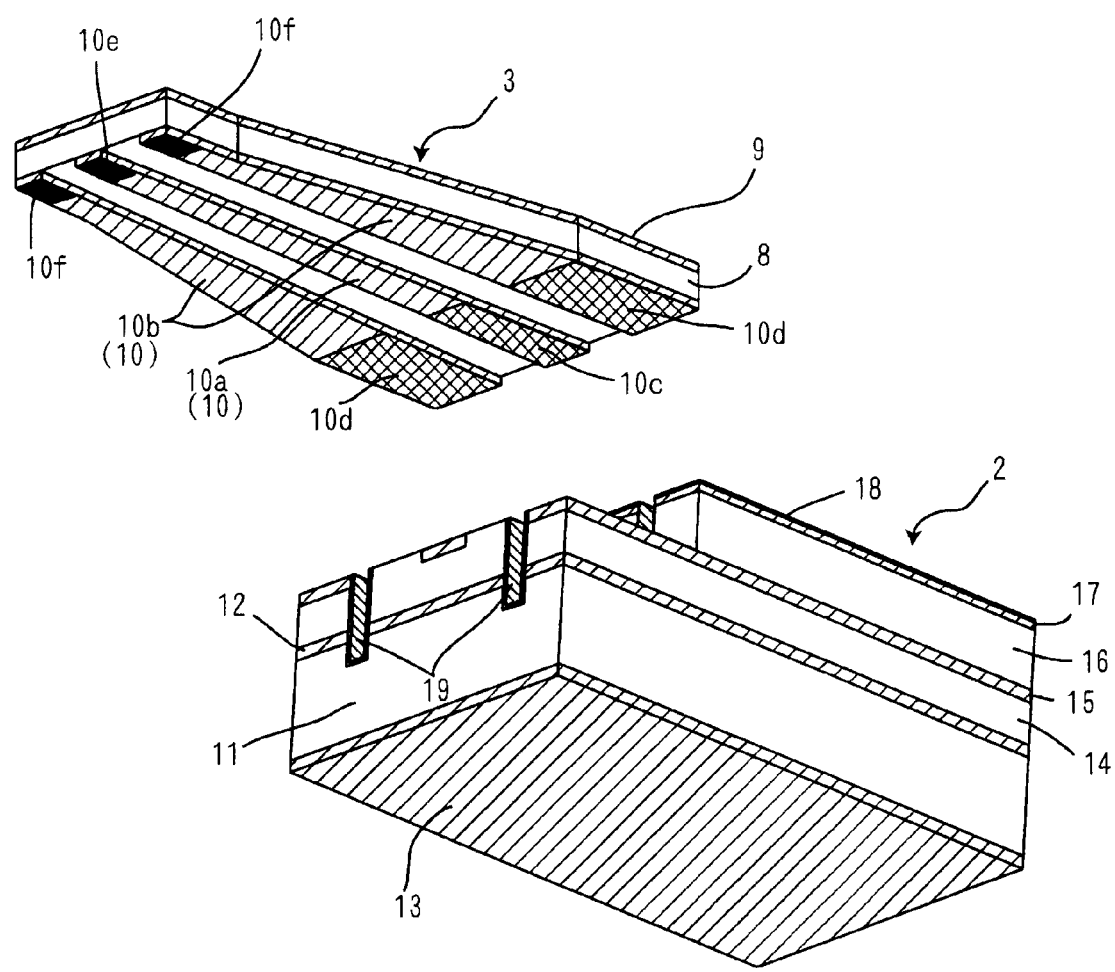
FIG. 4 is a perspective view from below of the probe main body and the probe tip part of the contact probe in FIG. 1.

Then, the structures of the probe main body 2 and the probe tip part 3 will be described in more detail. FIG. 3 is a perspective view from above of the probe main body 2 and the probe tip part 3. FIG. 4 is a perspective view from below.

Firstly, the structure of the probe main body 2 will be described. As shown in FIG. 3, the probe main body 2 is a printed wiring board made to be of a multilayer structure where an insulating layer 11, a metal layer 12, an insulating layer 14, a metal layer 15, an insulating layer 16, a metal layer 17, and a metal plated layer 18 are laminated in order on a ground layer 13 that is the lowermost layer. Among these, the metal layer 15 is constituted by a signal line 15a and ground lines 15b formed on both sides through the insulating layer 14. In other words, it is arranged that the signal line 15a is electrically insulated from the ground lines 15b.

Further, as shown in FIG. 3, along the extended direction of the signal line 15a and ground lines 15b, (two) groove portions 19 are formed on both sides of the signal line 15a from the upper surface of the probe main body 2 towards the lower part, and the metal plated layer 18 is formed also on surfaces of the groove portions 19. Here, the groove portions 19 intersect the ground lines 15b and are formed to have a depth to the extent of reaching the metal layer 12, so that the metal plated layer 18 allows the metal layer 12, the ground lines 15b, and the metal layer 17 to be electrically connected to one another. In other words, the coaxial line structure is provided where the shield electrodes which surround the signal line 15a through the insulating layer are formed.

Further, as shown in FIG. 3, at an upper tip of the probe main body 2, the upper surfaces of the signal line 15a and the ground lines 15b are exposed, and a cut-off portion 2a is provided to form a connection part connecting with the probe tip part 3.

Next, the structure of the probe tip part 3 will be described. As shown in FIG. 3 and FIG. 4, the probe tip part 3 is arranged to have a structure where a metal layer 9 is formed at an upper layer of an insulating layer 8, and a metal layer 10 is formed at a lower layer. As for the metal layer 10, as described above, the signal electrode 10a is formed in the center, and the ground electrodes 10b are formed on both the sides.

In the case where this probe tip part 3 is connected to the probe main body 2, it is arranged that the above-mentioned fine bumps 4 electrically connect a rear end 10c (see FIG. 4) of the signal electrode 10a with the upper surface (see FIG. 3) of signal line 15a at the cut-off portion 2a, and rear ends 10d (see FIG. 4) of the ground electrodes 10b with the upper surfaces (see FIG. 3) of ground lines 15b at the cut-off portion 2a.

In addition, it is arranged that a tip part 10e of the signal electrode 10a as shown in FIG. 4 and tip parts 10f of the ground electrodes 10b are respectively provided with the contact bumps 7a and 7b as shown in FIG. 2.

Then, a method of making the probe main body 2 and the probe tip part 3 will be described. At first, according to the flowchart in FIG. 5 and the illustrated flow steps in FIG. 6A through FIG. 6H corresponding to the flowchart, the method of making the probe main body 2 having the coaxial line structure will be described.

Figure 5:
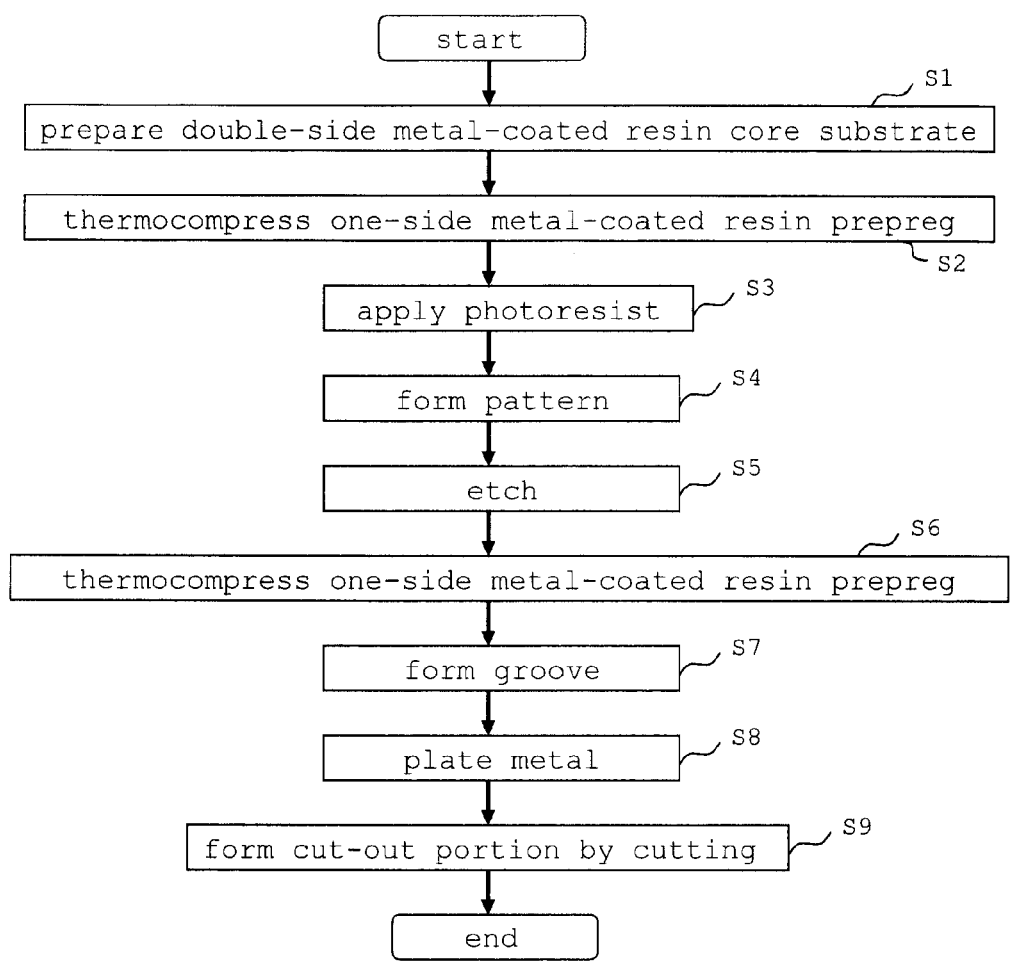
FIG. 5 is a flowchart showing a method of making the probe main body.
Figure 6A:
FIG. 6A is a sectional view illustrating a flow step corresponding to the flowchart in FIG. 5.

Firstly, as shown in FIG. 6A, a double-side metal-coated resin core substrate in which the thin-film metal layers 12 and 13 are respectively laminated to both sides of the insulating layer 11 is prepared (step S1 in FIG. 5).

Figure 6B:
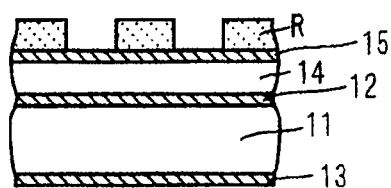
FIG. 6B is a sectional view illustrating the flow step corresponding to the flowchart in FIG. 5 subsequent to FIG. 6A.

Subsequently, as shown in FIG. 6B, the insulating layer 14 whose one side is joined with the metal layer 15 is laminated onto the metal layer 12. In particular, a one-side metal-coated resin prepreg is thermocompressed on the metal layer 12 (step S2 in FIG. 5), so that the insulating layer 14 is formed on the metal layer 12, on which the metal layer 15 is formed.

Further, as shown in FIG. 6B, photoresist R is applied onto the metal layer 15 (step S3 in FIG. 5), and a predetermined resist pattern is formed by way of exposure and development processes (step S4 in FIG. 5).

Figure 6C:
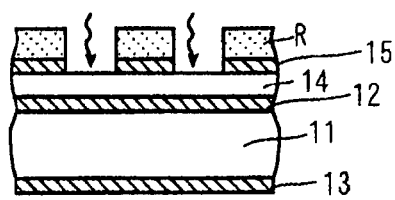
FIG. 6C is a sectional view illustrating the flow step corresponding to the flowchart in FIG. 5 subsequent to FIG. 6B.

Subsequently, as shown in FIG. 6C, an etching process is performed by using a resist pattern as a mask, and a metal wiring pattern is formed on the metal layer 15 (step S5 in FIG. 5). Accordingly, the metal wiring pattern of the signal line 15a and ground lines 15b is formed.

Figure 6D:
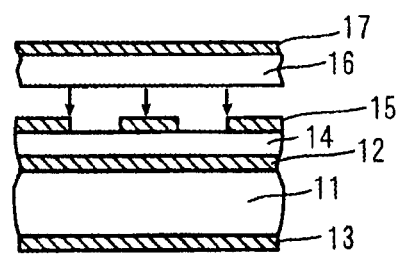
FIG. 6D is a sectional view illustrating the flow step corresponding to the flowchart in FIG. 5 subsequent to FIG. 6C.
Figure 6E:
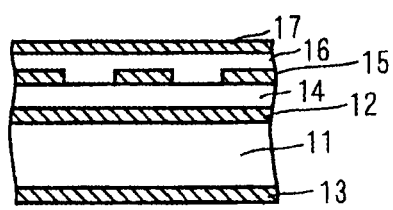
FIG. 6E is a sectional view illustrating the flow step corresponding to the flowchart in FIG. 5 subsequent to FIG. 6D.

As the pattern formation of the metal layer 15 is achieved and the photoresist R is removed, the insulating layer 16 whose one side is joined with the metal layer 17 is laminated onto the metal layer 15 as shown in FIG. 6D. In particular, the one-side metal-coated resin prepreg is thermocompressed on the metal layer 15 (metal wiring pattern) (step S6 in FIG. 5). Accordingly, the insulating layer 16 and the metal layer 17 are laminated to form a strip line (signal line 15a).

Figure 6F:
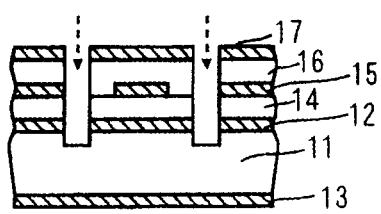
FIG. 6F is a sectional view illustrating the flow step corresponding to the flowchart in FIG. 5 subsequent to FIG. 6E.

Subsequently, as shown in FIG. 6F, a grooving process is carried out by way of laser beam irradiation, an end mill process, etc., so that the grooves are formed on both the sides of the signal line 15a along the extended direction of the signal line 15a, to intersect the ground lines 15b downwardly from above and to reach a layer lower than the signal line 15a i.e. the metal layer 12 (step S7 in FIG. 5).

Figure 6G:
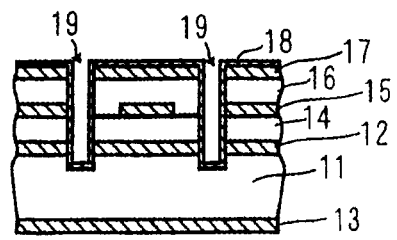
FIG. 6G is a sectional view illustrating the flow step corresponding to the flowchart in FIG. 5 subsequent to FIG. 6F.

Then, as shown in FIG. 6G, the upper surfaces and the groove portions 19 are subjected to a metal plating process (step S8 in FIG. 5). By means of this metal plated layer 18, the metal layer 12 and the metal layer 17 are electrically connected, and the printed wiring board with the coaxial line structure is formed.

Figure 6H:
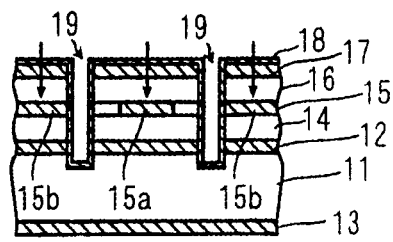
FIG. 6H is a sectional view illustrating the flow step corresponding to the flowchart in FIG. 5 subsequent to FIG. 6G.

Subsequently, as shown in FIG. 6H, the cut-off portion 2a is formed by cutting at a tip upper part of the printed wiring board with the coaxial line structure, whereby a predetermined area of the upper surfaces of the signal line 15a and the ground lines 15b is exposed, the connection part connecting with the probe tip part 3 is formed, and the probe main body 2 is completed after the whole forming processes (step S9 in FIG. 5).

In addition, it is preferable that each of the above-mentioned insulating layers is a prepreg including any of polyimide resin, BOB resin, polyamide resin, polyoxazole resin, epoxy resin, Teflon (registered trademark) resin, and cycloolefin resin.

Further, it is desirable that each of the above-mentioned metal layers formed of either gold, silver, or copper and the metal plated layer 18 is copper plated.

Further, the method of forming the above mentioned cut-off portion 2a may be a method disclosed in Japanese Patent Application Publication (KOKAI) No. H10-242594 and Japanese Patent Application Publication (KOKAI) No. 2001-156444, i.e., a method of manufacturing a printed wiring board in which an opening is formed in the printed board.

The method is such that a cut-off portion is provided beforehand for a prepreg layer of the printed circuit corresponding to a portion wishing to form the cut-off portion, a printed wiring board is made through the usual lamination process, and they are unified.

Hereafter, using the illustrated flow steps in FIG. 18A through FIG. 28B, a particular example will be described along with the flowchart in FIG. 29. In addition, FIG. 18A, FIG. 19A, FIG. 20A, FIG. 21A, FIG. 22A, FIG. 23A, FIG. 24A, FIG. 25A, FIG. 26A, FIG. 27A, and FIG. 28A are views from the front side of the probe main body 2 to be made, and FIG. 18B, FIG. 19B, FIG. 20B, FIG. 21B, FIG. 22B, FIG. 23B, FIG. 24B, FIG. 25B, FIG. 26B, FIG. 27B, and FIG. 28B are the side views corresponding to them.

Figure 18A:
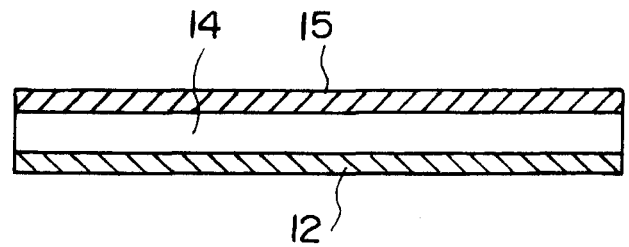
FIG. 18A is a sectional view (front view) illustrating a flow step, for explaining another method of forming a cut-off portion.
Figure 18B:
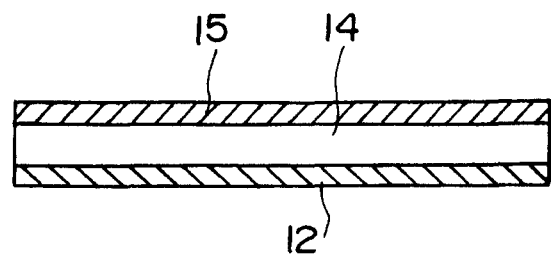
FIG. 18B is a sectional view (side view) illustrating a flow step, for explaining another method of forming the cut-off portion.
Figure 29:
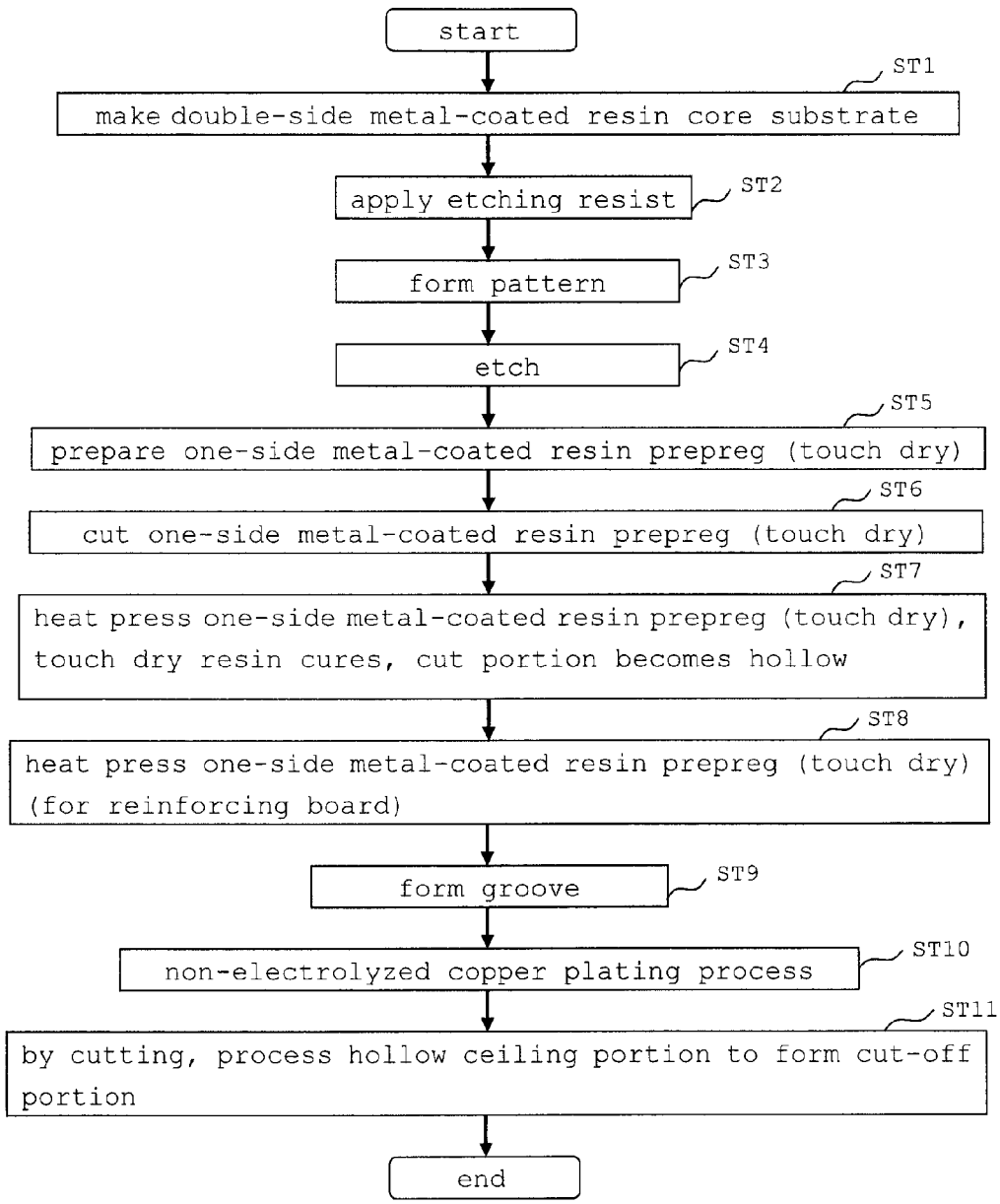
FIG. 29 is a flowchart for explaining another method of forming the cut-off portion.

Firstly, as shown in FIG. 18A and FIG. 18B, the double sided metal clad resin core substrate is prepared in which the thin-film metal layers 15 and 12 are respectively joined with both sides of the insulating layer 14 (step ST1 in FIG. 29).

Figure 19A:
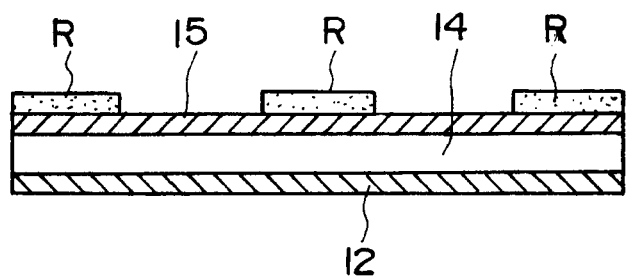
FIG. 19A is a sectional view (front view) illustrating a flow step, for explaining another method of forming the cut-off portion.
Figure 19B:
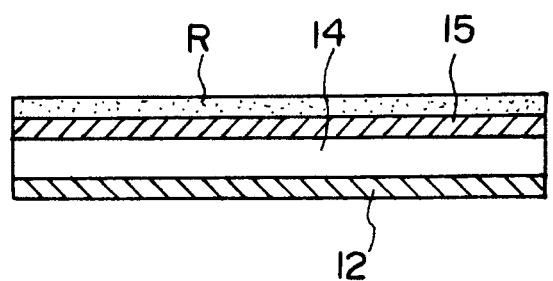
FIG. 19B is a sectional view (side view) illustrating a flow step, for explaining another method of forming the cut-off portion.

Then, as shown in FIG. 19A and FIG. 19B, the photoresist R is applied onto the metal layer 15 (step ST2 in FIG. 29), and the predetermined resist pattern is formed by way of the exposure and development processes (step ST3 in FIG. 29).

Figure 20A:
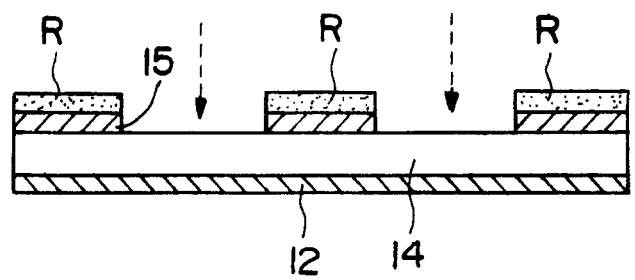
FIG. 20A is a sectional view (front view) illustrating a flow step, for explaining another method of forming the cut-off portion.
Figure 20B:
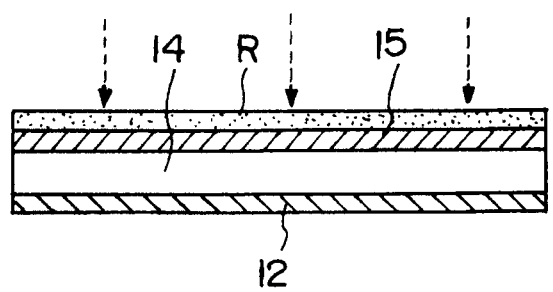
FIG. 20B is a sectional view (side view) illustrating a flow step, for explaining another method of forming the cut-off portion.

Subsequently, as shown in FIG. 20A and FIG. 20B, an etching process is performed by using a resist pattern as a mask, and a metal wiring pattern is formed on the metal layer 15 (step ST4 of FIG. 29). Accordingly, the metal wiring pattern is formed (hereinafter metal layer 15 may be referred to as metal wiring pattern 15).

Figure 21A:
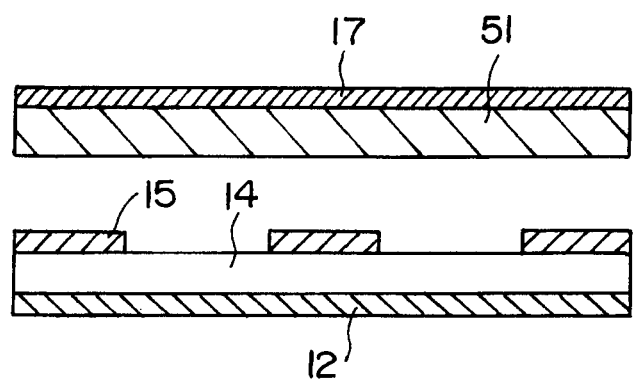
FIG. 21A is a sectional view (front view) illustrating a flow step, for explaining another method of forming the cut-off portion.
Figure 21B:
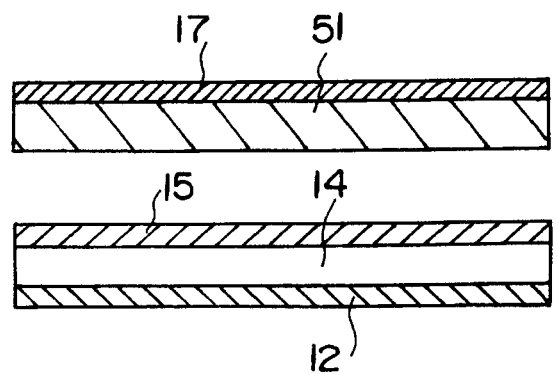
FIG. 21B is a sectional view (side view) illustrating a flow step, for explaining another method of forming the cut-off portion.
Figure 22A:
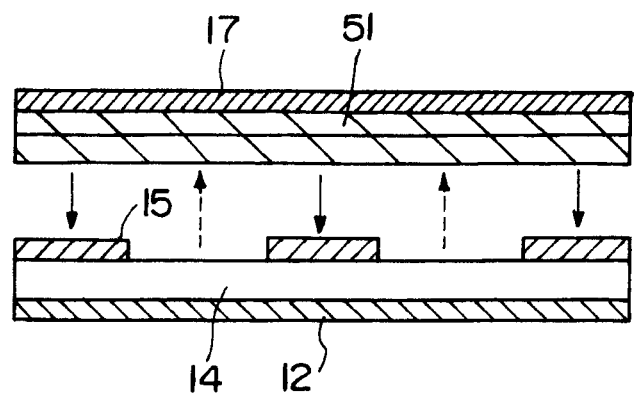
FIG. 22A is a sectional view (front view) illustrating a flow step, for explaining another method of forming the cut-off portion.
Figure 22B:
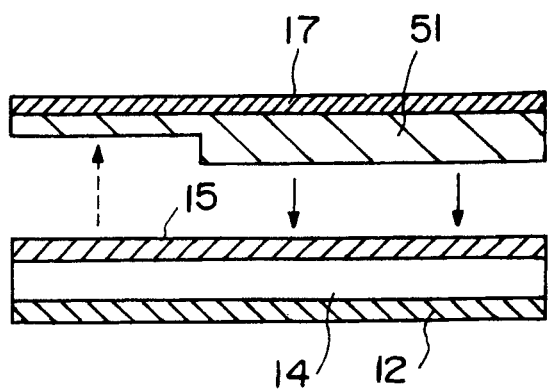
FIG. 22B is a sectional view (side view) illustrating a flow step, for explaining another method of forming the cut-off portion.

As the pattern formation of the metal layer 15 is achieved and the photoresist R is removed, a partially cured resin layer 51 whose upper surface is joined with the metal layer 17 is prepared (step ST5 in FIG. 29) as shown in FIG. 21A and FIG. 21B, and the tip portion of the partially cured resin layer 51 is subjected to cut-off processing (step ST6 of FIG. 29) as shown in FIG. 22A and FIG. 22B. In addition, the partially cured resin layer 51 is made from a resin layer in a pre-cured state, generally referred to as non-flow resin and low flow resin, and epoxy resin in the partially cured state, phenol resin, imide resin, BT resin, Teflon (registered trademark) resin, etc. are used.

Figure 23A:
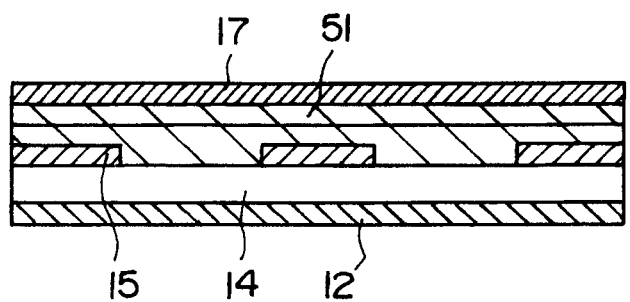
FIG. 23A is a sectional view (front view) illustrating a flow step, for explaining another method of forming the cut-off portion.
Figure 23B:
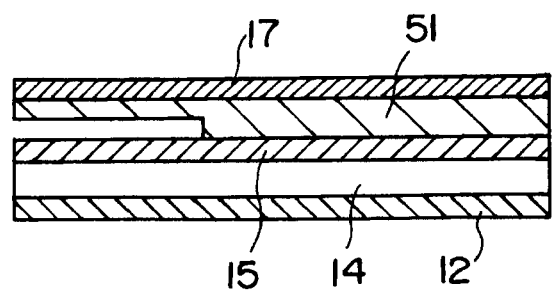
FIG. 23B is a sectional view (side view) illustrating a flow step, for explaining another method of forming the cut-off portion.

As shown in FIG. 23A and FIG. 23B, the partially cured resin layer 51 is heat pressed on the metal wiring pattern 15, to thereby cure the partially cured resin layer 51 completely (step ST7 in FIG. 29). Further, at this time, as illustrated, part of the partially cured resin 51 subjected to the cut processing is hollow.

Figure 24A:
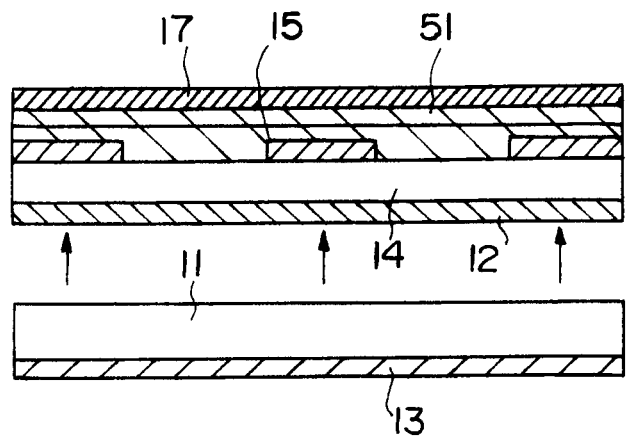
FIG. 24A is a sectional view (front view) illustrating a flow step, for explaining another method of forming the cut-off portion.
Figure 24B:
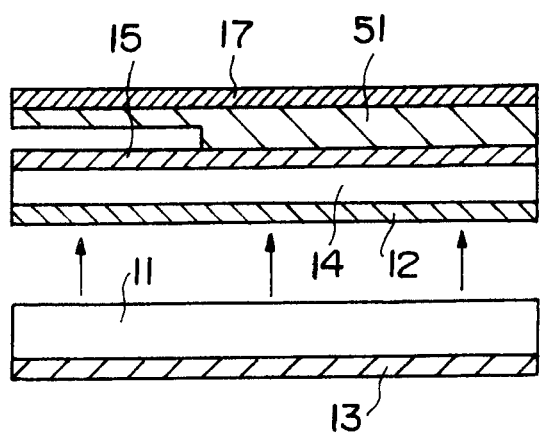
FIG. 24B is a sectional view (side view) illustrating a flow step, for explaining another method of forming the cut-off portion.

Next, as shown in FIG. 24A and FIG. 24B, the insulating layer 11 (single sided metal clad resin prepreg) whose underside is joined with the metal layer 13 is thermocompressed from the underside of the metal layer 12 for reinforcement (step ST8 in FIG. 29).

Figure 25A:
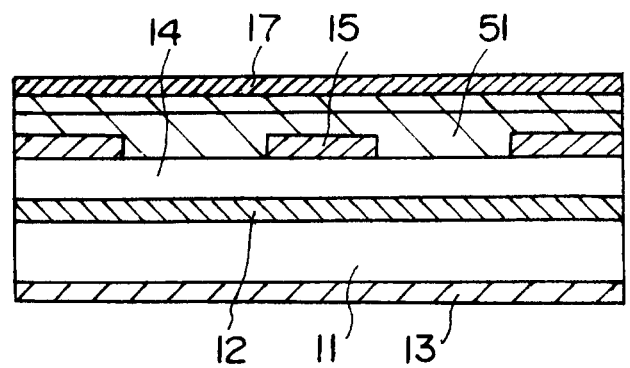
FIG. 25A is a sectional view (front view) illustrating a flow step, for explaining another method of forming the cut-off portion.
Figure 25B:
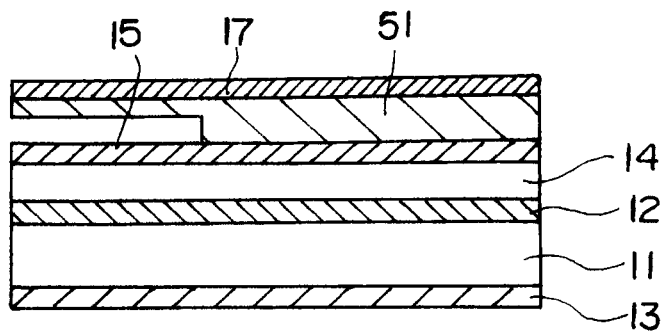
FIG. 25B is a sectional view (side view) illustrating a flow step, for explaining another method of forming the cut-off portion.
Figure 26A:
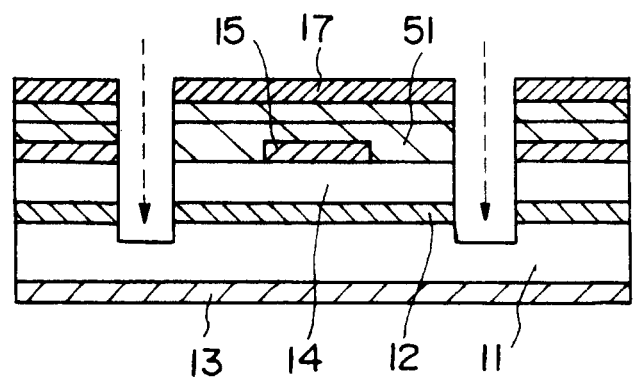
FIG. 26A is a sectional view (front view) illustrating a flow step, for explaining another method of forming the cut-off portion.
Figure 26B:
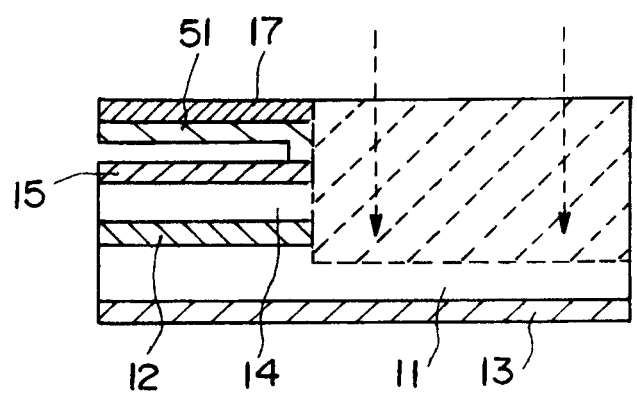
FIG. 26B is a sectional view (side view) illustrating a flow step, for explaining another method of forming the cut-off portion.

Being reinforced to be in a state as shown in FIG. 25A and FIG. 25B, the grooving process is carried out by way of the laser beam irradiation, the end mill etc., so as to reach the metal layer 12 as shown in FIG. 26A and FIG. 26B (step ST9 of FIG. 29).

Figure 27A:
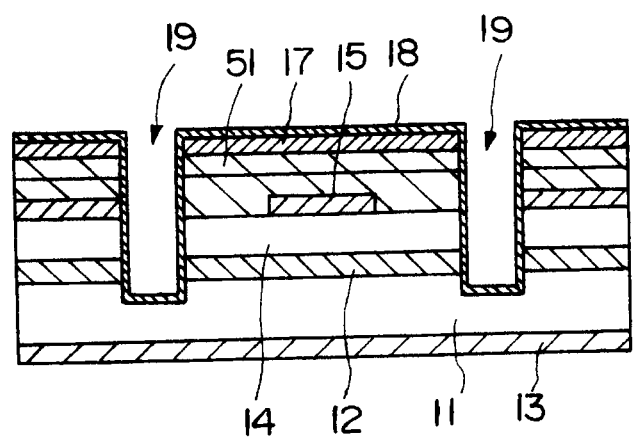
FIG. 27A is a sectional view (front view) illustrating a flow step, for explaining another method of forming the cut-off portion.
Figure 27B:
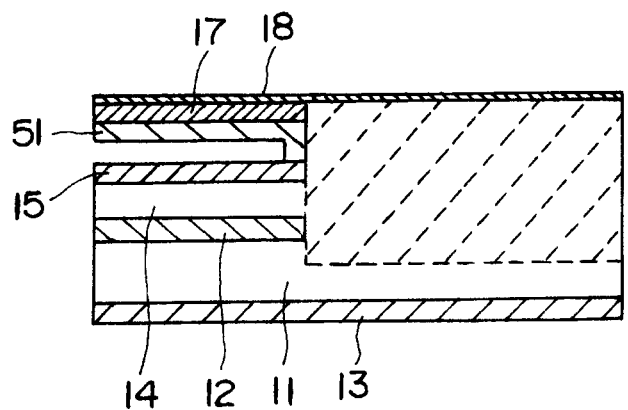
FIG. 27B is a sectional view (side view) illustrating a flow step, for explaining another method of forming the cut-off portion.

As shown in FIG. 27A and FIG. 27B, the upper surfaces and the groove portions 19 are subjected to the metal plating process (electroless copper plating process) (step ST10 of FIG. 29). By means of this metal plated layer 18, the metal layer 12 and the metal layer 17 are electrically connected together, and the printed wiring board of coaxial line structure is formed.

Figure 28A:
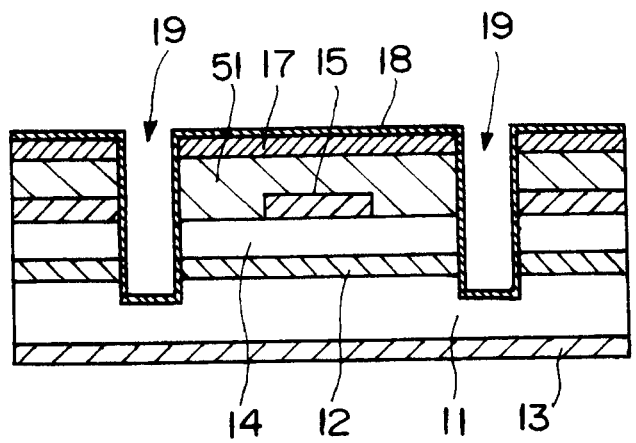
FIG. 28A is a sectional view (front view) illustrating a flow step, for explaining another method of forming the cut-off portion.
Figure 28B:
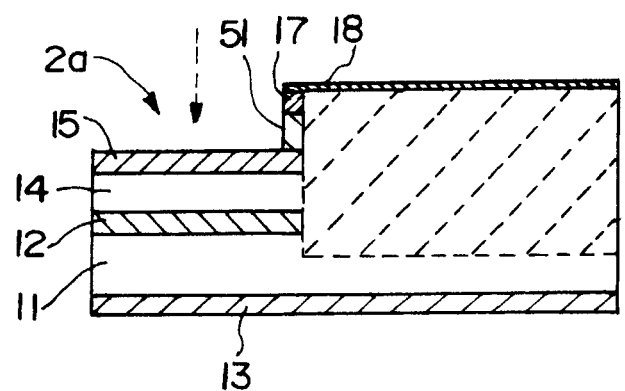
FIG. 28B is a sectional view (side view) illustrating a flow step, for explaining another method of forming the cut-off portion.

Subsequently, as shown in FIG. 28A and FIG. 28B, a portion of the partially cured resin layer 51 which is hollow is removed by cutting to form the cut-off portion 2a (step ST11 of FIG. 29).

Then, according to the flowchart in FIG. 7 and the flow steps of FIG. 8A through FIG. 8E corresponding to the flowchart, a method of making the probe tip part 3 (without contact bumps 7) on the substrate 5 shown in FIG. 1 by way of a lift-off method will be described.

Figure 7:
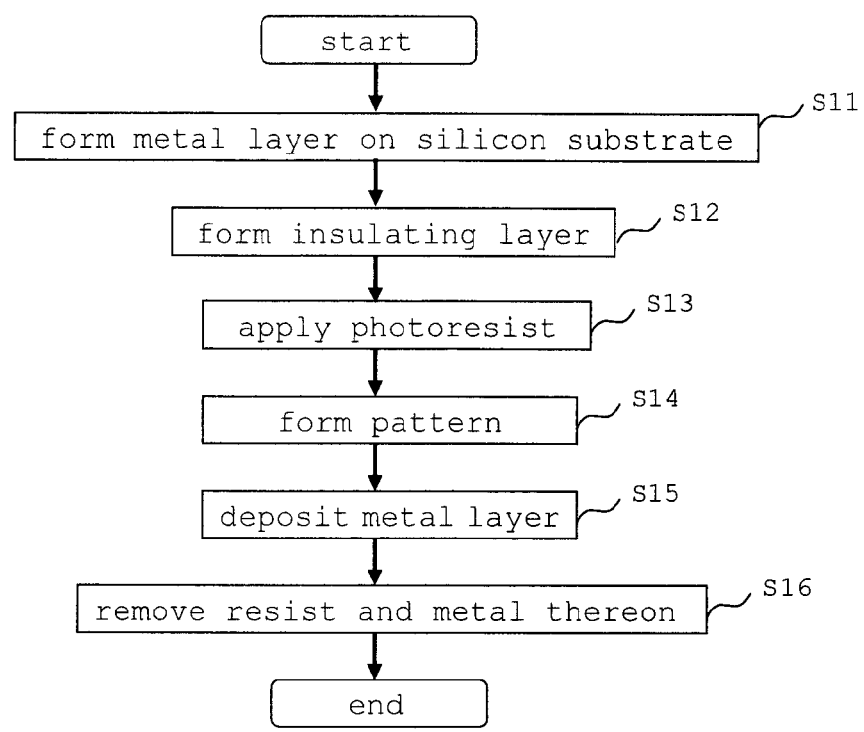
FIG. 7 is a flowchart showing a method of making the probe tip part.
Figure 8A:
FIG. 8A is a sectional view illustrating the flow step corresponding to the flowchart in FIG. 7.
Figure 8B:
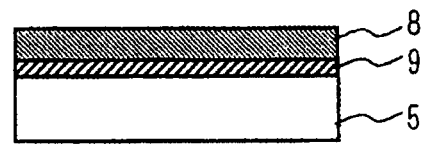
FIG. 8B is a sectional view illustrating the flow step corresponding to the flowchart in FIG. 7 subsequent to FIG. 8A.
Figure 8C:
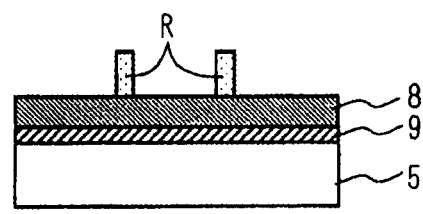
FIG. 8C is a sectional view illustrating the flow step corresponding to the flowchart in FIG. 7 subsequent to FIG. 8B.

First, as shown in FIG. 8A, by any of techniques, such as vacuum deposition, sputtering, CVD, plating, etc., the metal layer 9 is formed on the upper surface of the substrate 5 which is made of silicon or glass (step S11 in FIG. 7), and the insulating layer 8 is further formed on the metal layer 9 (step S12 in FIG. 7).

Figure 8D:
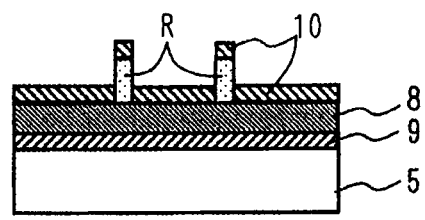
FIG. 8D is a sectional view illustrating the flow step corresponding to the flowchart in FIG. 7 subsequent to FIG. 8C.

Next, the photoresist R is applied to the insulating layer 8 (step S13 in FIG. 7), and a resist pattern is formed by way of the exposure and development processes, as shown in FIG. 8D (step S14 in FIG. 7).

Subsequently, by any of the techniques, such as vacuum deposition, sputtering, CVD, plating, etc., the metal layer 10 is deposited on the insulating layer 8 in which the resist pattern is formed as shown in FIG. 8D (step S15 in FIG. 7).

Figure 8E:
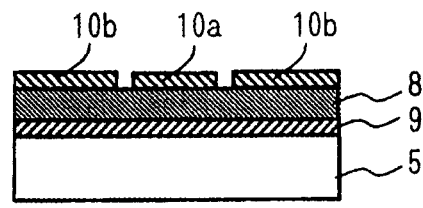
FIG. 8E is a sectional view illustrating the flow step corresponding to the flowchart in FIG. 7 subsequent to FIG. 8D.

As shown in FIG. 8E, the photoresist R is removed by soaking the substrate in a solvent, whereby the metal layer 10 on the resist pattern is removed, the metal wiring pattern of the signal electrode 10a and the ground electrodes 10b is formed on the insulating layer 8, and the probe tip part 3 is completed (step S16 in FIG. 7).

Then, according to the flowchart in FIG. 9 and the flow steps in FIG. 10A through FIG. 10F corresponding to the flowchart, a meted of making the probe tip part 3 (without contact bumps 7) on the substrate 5 by the etching process will be described.

Figure 9:
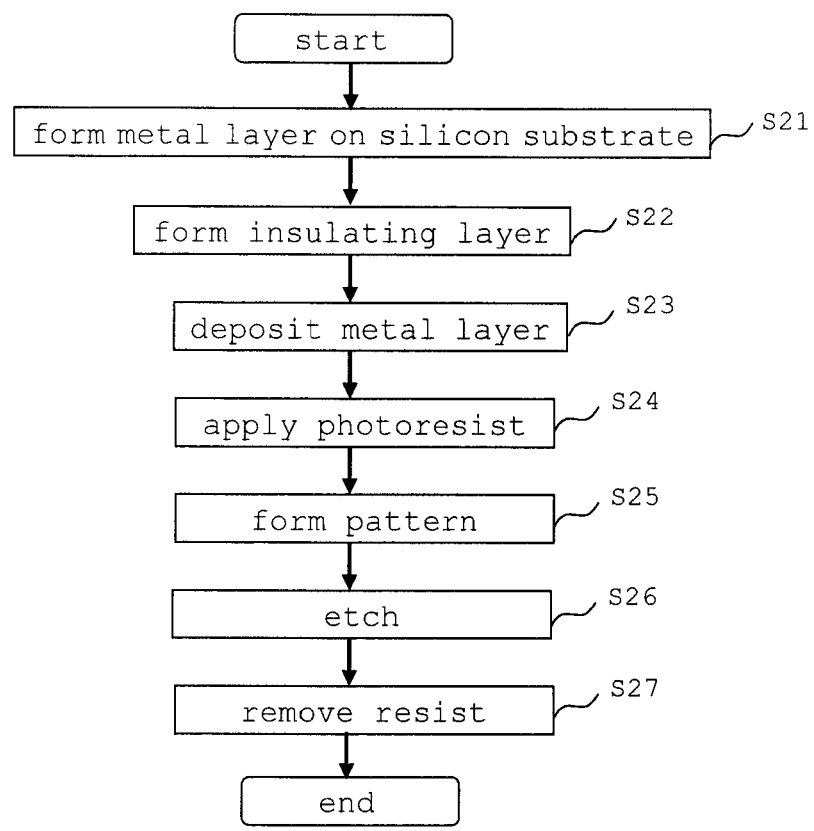
FIG. 9 is a flowchart showing another method of making the probe tip part.
Figure 10A:
FIG. 10A is a sectional view illustrating the flow step corresponding to the flowchart in FIG. 9.
Figure 10B:
FIG. 10B is a sectional view illustrating the flow step corresponding to the flowchart in FIG. 9 subsequent to FIG. 10A.
Figure 10C:
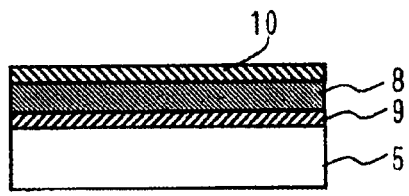
FIG. 10C is a sectional view illustrating the flow step corresponding to the flowchart in FIG. 9 subsequent to FIG. 10B.

First, as shown in FIG. 10A, by any of the techniques, such as vacuum deposition, sputtering, CVD, plating, etc., the metal layer 9 is formed on the upper surface of the substrate 5 which is made of silicon or glass (step S21 in FIG. 9), and the insulating layer 8 is further formed on the metal layer 9 (step S22 in FIG. 9).

Subsequently, as shown in FIG. 10O, by any of the techniques, such as vacuum deposition, sputtering, CVD, plating, etc., the metal layer 10 is formed on the insulating layer 8 (step S23 in FIG. 9).

Figure 10D:
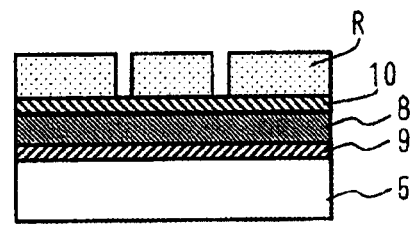
FIG. 10D is a sectional view illustrating the flow step corresponding to the flowchart in FIG. 9 subsequent to FIG. 10O.

Next, the photoresist R is applied onto the metal layer 10 (step S24 in FIG. 9), and a resist pattern is formed by way of the exposure and development processes, as shown in FIG. 10D (step S25 in FIG. 9).

Figure 10E:
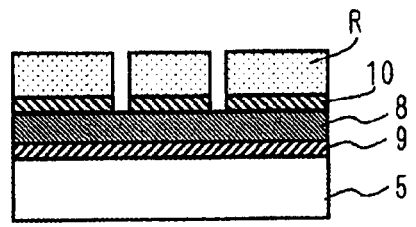
FIG. 10E is a sectional view illustrating the flow step corresponding to the flowchart in FIG. 9 subsequent to FIG. 10D.

As shown in FIG. 10E, the metal layer 10 is processed by using a resist pattern as a mask by way of chemistry or plasma etching, and the metal wiring pattern to be the signal electrode 10a and the ground electrodes 10b is formed (step S26 in FIG. 9).

Figure 10F:
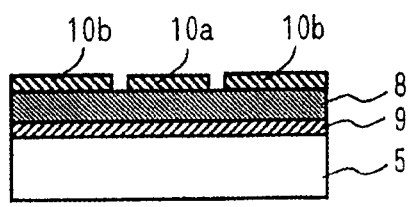
FIG. 10F is a sectional view illustrating the flow step corresponding to the flowchart in FIG. 9 subsequent to FIG. 10E.

Finally, the photoresist R is removed by soaking the substrate in the solvent as shown in FIG. 10F, to thereby complete the probe tip part 3 (step S27 in FIG. 9).

In addition, according to the production method as described above with reference to the flowchart in FIG. 9, it is possible to provide an electrode pitch of less than 10 µm (minimum is 2 µm).

Then, according to the flowchart in FIG. 11 and the flow steps in FIG. 12A through FIG. 12D corresponding to the flowchart, a method of making the probe tip part 3 (without contact bumps 7) by way of the etching process without using the substrate 5 will be described.

Figure 11:
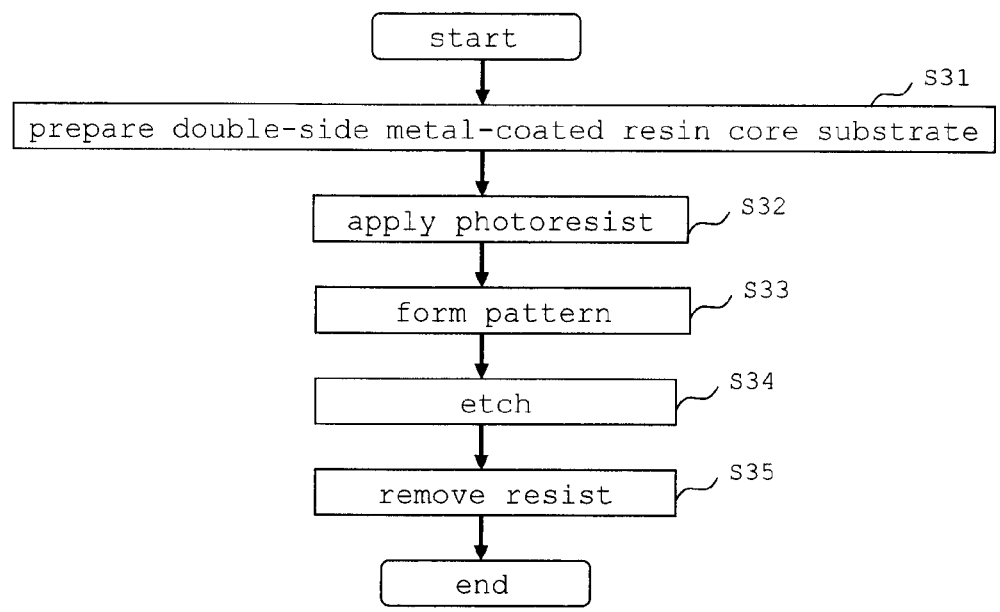
FIG. 11 is a flowchart showing another method of making the probe tip part.
Figure 12A:
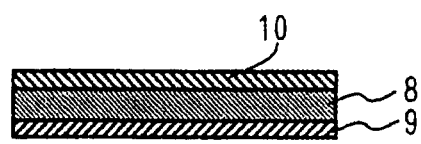
FIG. 12A is a sectional view illustrating the flow step corresponding to the flowchart in FIG. 11.

First, as shown in FIG. 12A, the double sided metal clad resin core substrate in which the thin-film metal layers 9 and 10 are respectively joined with both sides of the insulating layer 8 is prepared (step S31 in FIG. 11).

Figure 12B:
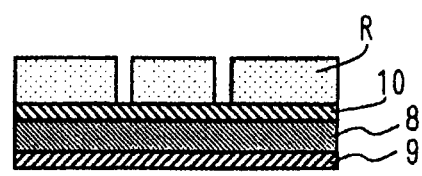
FIG. 12B is a sectional view illustrating the flow step corresponding to the flowchart in FIG. 11 subsequent to FIG. 12A.

Next, the photoresist R is applied to the metal layer 10 (step S32 in FIG. 11), and a resist pattern is formed by way of the exposure and development processes as shown in FIG. 12B (step S33 of FIG. 11).

Figure 12C:
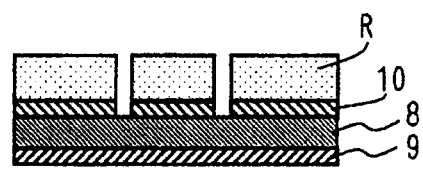
FIG. 12C is a sectional view illustrating the flow step corresponding to the flowchart in FIG. 11 subsequent to FIG. 12B.

As shown in FIG. 12C, the metal layer 10 is processed by using a resist pattern as a mask by way of chemistry or plasma etching, and the metal wiring pattern to be the signal electrode 10a and the ground electrodes 10b is formed (step S34 in FIG. 11).

Figure 12D:
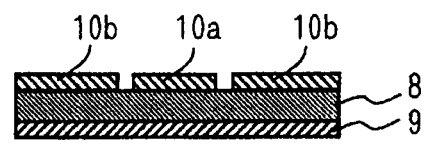
FIG. 12D is a sectional view illustrating the flow step corresponding to the flowchart in FIG. 11 subsequent to FIG. 12C.

Finally, by soaking the substrate in the solvent, the photoresist R is removed as shown in FIG. 12D, to thereby complete the probe tip part 3 (step S35 in FIG. 11).

In addition, according to the production method as described above with reference to the flowchart in FIG. 11, it is possible to provide an electrode pitch of 10 µm (minimum).

In addition, in the method of making the probe tip part 3 as described with reference to FIG. 7-FIG. 12D, it is preferable that each insulating layer of the probe tip part 3 is a prepreg including any of polyimide resin, BCB resin, polyamide resin, polyoxazole resin, epoxy resin, Teflon (registered trademark) resin, and cycloolefin resin. Further, it is desirable that each of the above-mentioned metal layers is formed of either gold, silver, or copper.

Then, according to the flowchart in FIG. 13 and the flow steps in FIG. 14A through FIG. 14D corresponding to the flowchart, a method of making the contact bumps 7 at the probe tip part 3 will be described. In addition, in this description, a case where the contact bumps 7 are provided for the probe tip part 3 formed on the substrate 5 will be described by way of example.

Figure 13:
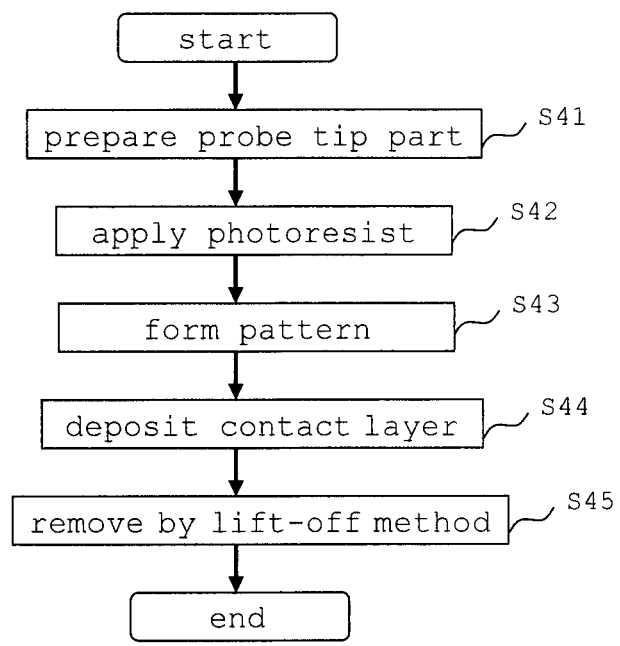
FIG. 13 is a flowchart showing a method of making contact bumps of the probe tip part.
Figure 14A:
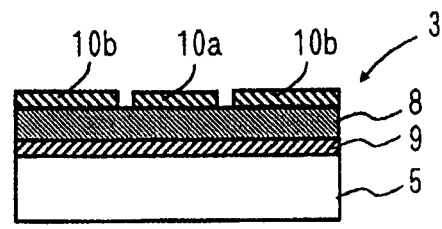
FIG. 14A is a sectional view illustrating the flow step corresponding to the flowchart in FIG. 13.

First, as shown in FIG. 14A, the probe tip part 3 (printed wiring board) is prepared which has not formed therein the contact bumps to be made by way of the process of FIG. 7 or FIG. 9 (step S41 in FIG. 13).

Figure 14B:
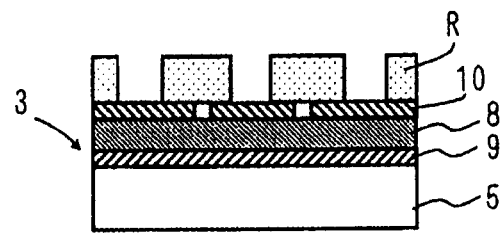
FIG. 14B is a sectional view illustrating the flow step corresponding to the flowchart in FIG. 13 subsequent to FIG. 14A.

Subsequently, the photoresist R is applied onto the metal layer 10 (step S42 in FIG. 13), and a resist pattern R is formed by way of exposure and development as shown in FIG. 14B (step S43 of FIG. 13).

Figure 14C:
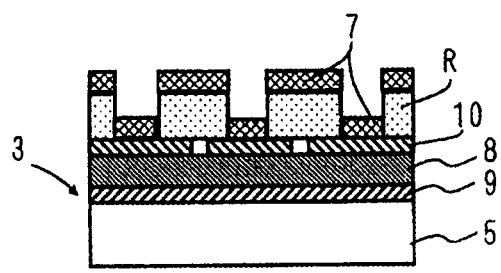
FIG. 14C is a sectional view illustrating the flow step corresponding to the flowchart in FIG. 13 subsequent to FIG. 14B.

As shown in FIG. 14C, any one of gold, silver, copper, etc., is deposited on the resist pattern R by any of the techniques, such as vacuum deposition, sputtering, CVD, plating, etc., to form the contact layer 7 (step S44 in FIG. 13).

Figure 14D:
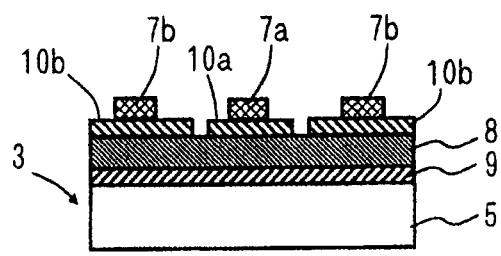
FIG. 14D is a sectional view illustrating the flow step corresponding to the flowchart in FIG. 13 subsequent to FIG. 14C.

Further, as shown in FIG. 14D, the photoresist R is removed by soaking the substrate in the solvent, whereby the contact layer 7 on the resist pattern is removed, whereby the signal contact bump 7a is formed on signal electrode 10a, and the grounding contact bumps 7b are formed on the ground electrodes 10b (step S45 in FIG. 13).

In addition, in the case where contact durability is required, it is desirable that a metal material for the contact bumps 7 is a metal with high hardness. As examples of such a metal, there may be mentioned nickel, nickel alloy, W, W alloy, Pt, Pt alloy, etc. Among these, nickel and nickel alloy are desirably subjected to an Au plating process in order to prevent surface oxidization.

As described above, according to the first preferred embodiment in accordance with the present invention, the contact probe 100 is made from the printed wiring board, so that the probe tip part 3 with the fine electrode pitch (for example, less than 50 µm) can be easily formed with sufficient accuracy.

Therefore, the probe tip 3 can be pressed against the fine pitch portion formed in the semiconductor integrated circuit, the package for the semiconductor integrated circuit, the printed circuit board, etc., and its high speed and high frequency measurement can be realized.

Further, since the electric connection between the probe tip part 3 and the measurement apparatus is achieved through the probe main body 2, the easy and exact connection can be achieved. In other words, since the probe main body 2 is made from the printed wiring board having the coaxial line structure, it is possible to facilitate the connection with the probe tip part 3 and the connection with the coaxial cable from the measurement apparatus respectively. In particular, since the connection between the probe tip part 3 to have the fine structure and the probe main body 2 having the coaxial line structure is connection between the substrates, it can be performed through the fine bumps 4, and it is possible to realize easy and exact electric connection.

Further, the probe main body 2 has the coaxial line structure, so that transmission efficiency of high speed and high frequency signal can be improved, the incoming noise and the cross talk occurred between the wirings can be reduced.

In addition, in the above-mentioned first preferred embodiment, although the electrode pitch between the signal contact bump 7a and the grounding contact bumps 7b is set to 10-50 µm, the contact probe of the present invention is not limited to it. Even in the case where the electrode pitch is arranged to be less than 10 µm or not less than 50 µm, it is possible to employ the contact probe and the method of making the same in accordance with the present invention, and obtain the above-mentioned operational effects.

Then, with reference to FIG. 15 through FIG. 17B, the contact probe corresponding to a plurality of channels (plurality of groups) will be described as a second preferred embodiment in accordance with the present invention.

Figure 15:
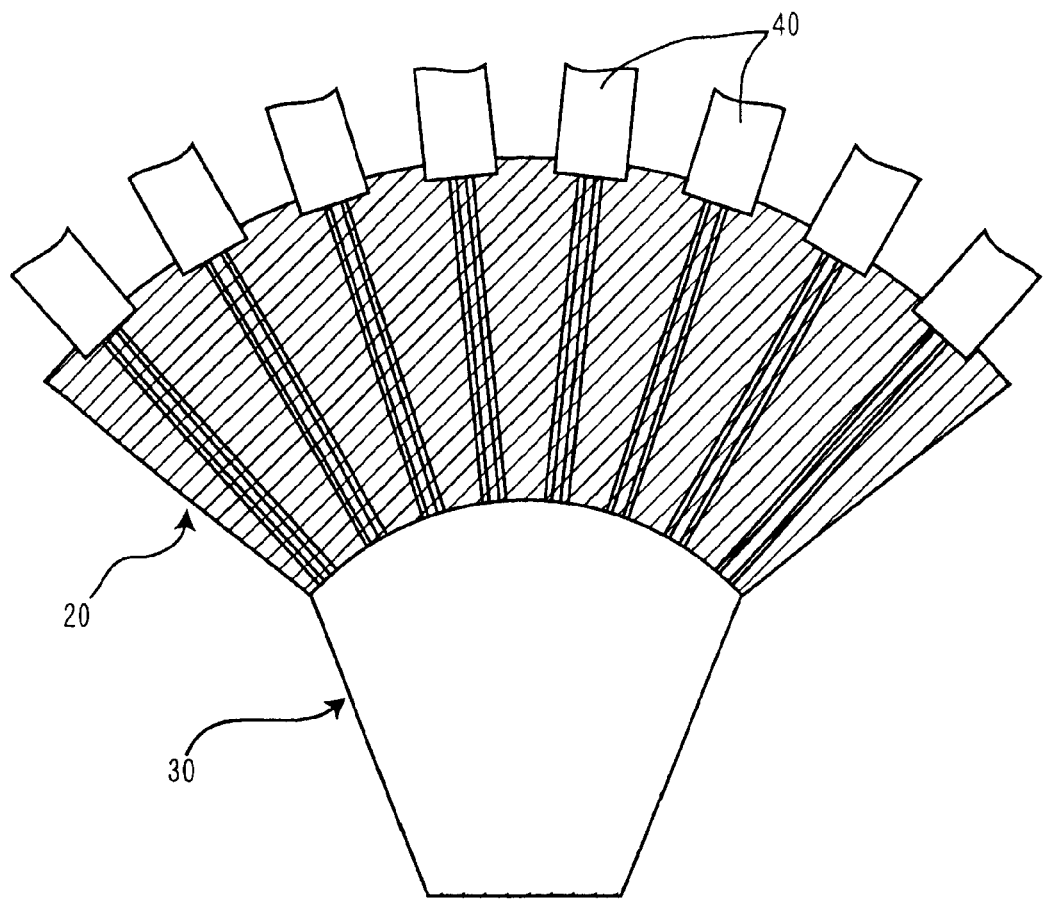
FIG. 15 is a plan view showing a second preferred embodiment of the contact probe in accordance with the present invention.
Figure 16A:
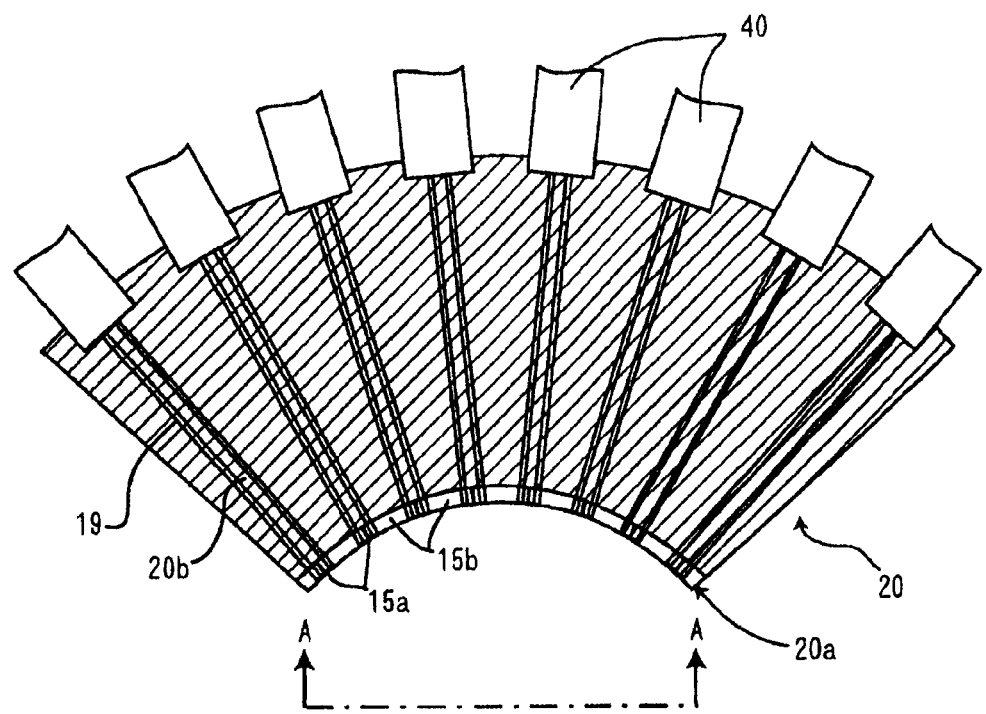
FIG. 16A is a plan view showing a structure of the probe main body of the contact probe of FIG. 15.
Figure 16B:
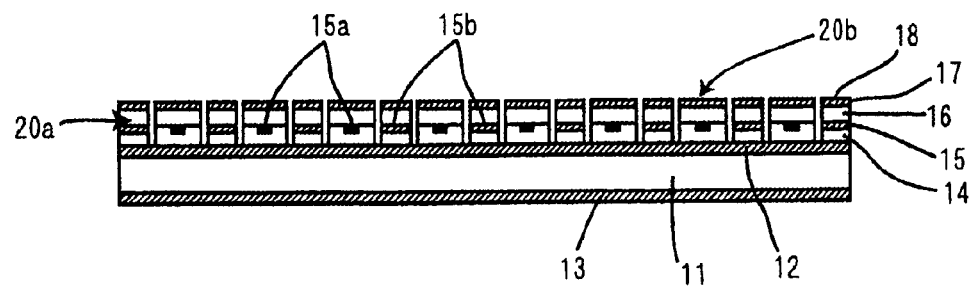
FIG. 16B is a sectional view along arrows A-A in FIG. 16A.
Figure 17A:
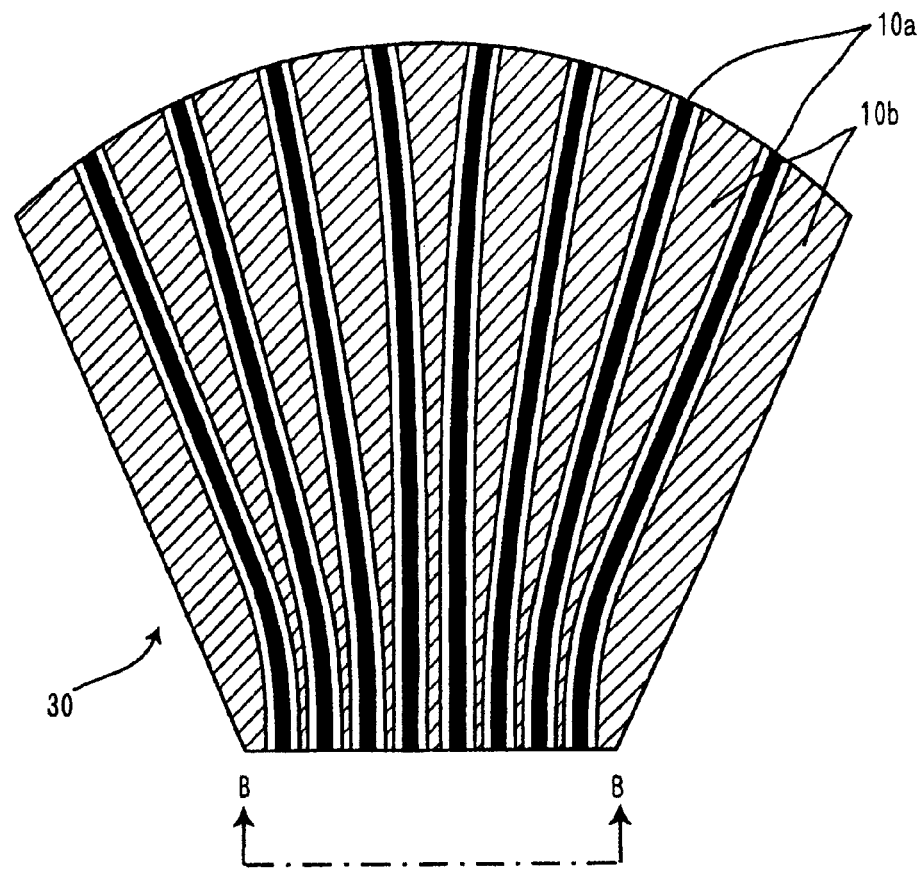
FIG. 17A is a plan view showing a structure of the probe tip part of the contact probe in FIG. 15.
Figure 17B:
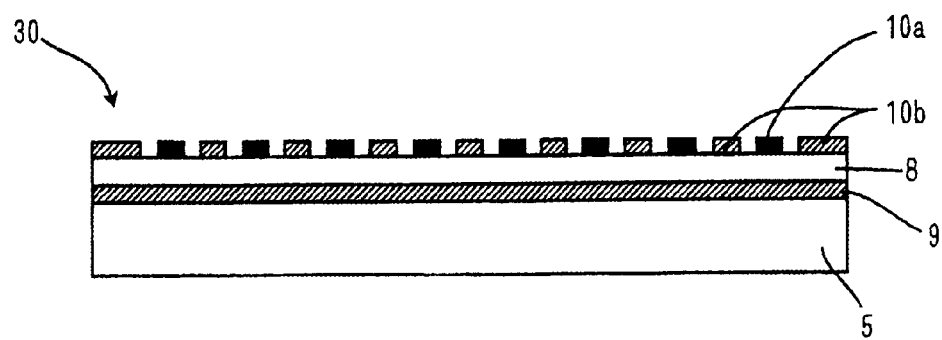
FIG. 17B is a sectional view along arrows B-B in FIG. 17A.

FIG. 15 is a plan view showing the second preferred embodiment of the contact probe in accordance with the present invention. FIG. 16A is a plan view showing a structure of the probe main body of the contact probe of FIG. 15, and FIG. 16B is a front view (along arrows A-A). Further, FIG. 17A is a plan view showing a structure of the probe tip part of the contact probe of FIG. 15, and FIG. 17B is a front view (along arrows B-B).

In addition, since the contact probe as shown in the second preferred embodiment can be made in a similar manner to the production method as shown in the above-mentioned first preferred embodiment, the detailed explanation of the production method will not be repeated. Further, like reference signs are used to refer to like parts, and the detailed description of them will not be repeated.

The contact probe 101 as shown in FIG. 15 is arranged such that the probe main body 20 and the probe tip part 30 are mutually joined by thermocompression using the fine bumps (not shown). The contact probe 101 as shown in FIG. 15 is arranged to cope with a plurality of channel signals (eight-channel is shown in figure by way of example), and it is possible to connect the tip of the coaxial cable 40 from the measurement apparatus (not shown) to the rear end of the probe main body 20.

As shown, the probe main body 20 is formed in the shape of a fan where a width at the tip is narrow and a width at the rear end is wide, and a pitch between adjoining coaxial cables is widened, so that a plurality of coaxial cables 40 can easily be connected together side-by-side.

Further, as shown in FIG. 16A and FIG. 16B, as for the probe main body 20, the cut-off portion 20a is formed at the tip part, and the rear end of the probe tip part 30 is connected to this cut-off portion 20a. Arranged side-by-side at a predetermined pitch in the cut-off portion 20a are tips of a plurality of coaxial lines 20b respectively connected to the corresponding coaxial cables 40. An upper surface of each of the signal line 15a and ground lines 15b is exposed.

On the other hand, as shown in FIG. 17A and FIG. 17B, like the probe main body 20, the probe tip part 30 is formed in the shape of a fan where a width at the tip is narrow and a width at the rear end is wide, and a pitch between adjoining signal electrodes 10a at the rear end is arranged to be the same as that of the signal lines 15a exposed side-by-side at the cut-off portion 20a of the probe main body 20.

Further, as for the tip of the probe tip part 30 used as a contact part with respect to the measuring object, a plurality of channels of signal electrodes 10a and ground electrodes 10b are arranged side-by-side. In addition, the pitch between the signal electrode 10a and ground electrode 10b which adjoin each other at the probe tip, and the pitch between the signal electrodes 10a are each arranged to have a predetermined value of 10-50 µm, for example.

Thus, as described in the first preferred embodiment, since the probe tip part 30 coping with the plurality of channels is produced by a printed wiring board formation technology, it is possible to form and arrange a plurality of contact electrodes at a desired pitch easily, even if the pitch between the adjacent electrodes is a fine pitch of less than 50 µm, for example.

As described above, according to the second preferred embodiment in accordance with the present invention, by making the probe tip part 30 with the printed wiring board, it is possible to form and arrange the plurality of channels of electrodes at the contact probe tip, in which the electrode pitch is fine (for example, less than 50 µm). Therefore, even in the case where the plurality of channels of measuring objects are located at a fine pitch, it is possible to measure the high speed and high frequency signal for each channel by the contact probe 101 which copes with the plurality of channels.

Further, by forming the shape of the probe main body 2 in the shape of a fan where the width of the rear end is wide, it is possible to widen the pitch between the adjoining channels at the rear end, and to easily achieve the connection with the coaxial cable which is from the measurement apparatus.

In addition, in the above-mentioned second preferred embodiment, although the pitch between the signal electrode 10a and ground electrode 10b and the pitch between the signal electrodes 10a are each set to 10-50 µm (for example), the contact probe of the present invention is not limited to it. In other words, according to the method of making the contact probe in accordance with the present invention, even in the case where the electrode pitches are each arranged to be less than 10 µm or not less than 50 µm (for example), a multi-channel contact probe (such as eight channels and 16 channels) which is difficult for the conventional production method to realize can be obtained easily, and it is possible to obtain the above-mentioned operational effects.

Figure 30A:
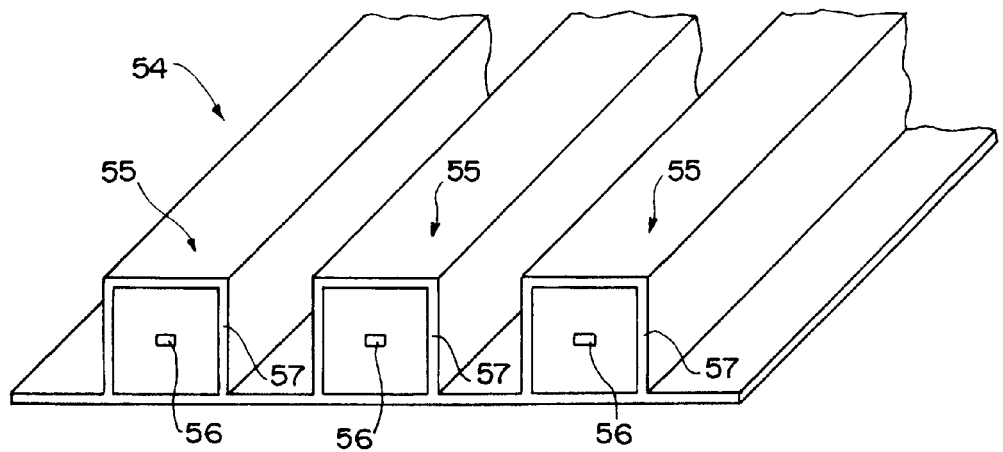
FIG. 30A is a view for explaining a method of connecting a coaxial cable to a coaxial line formed in the substrate.
Figure 30B:
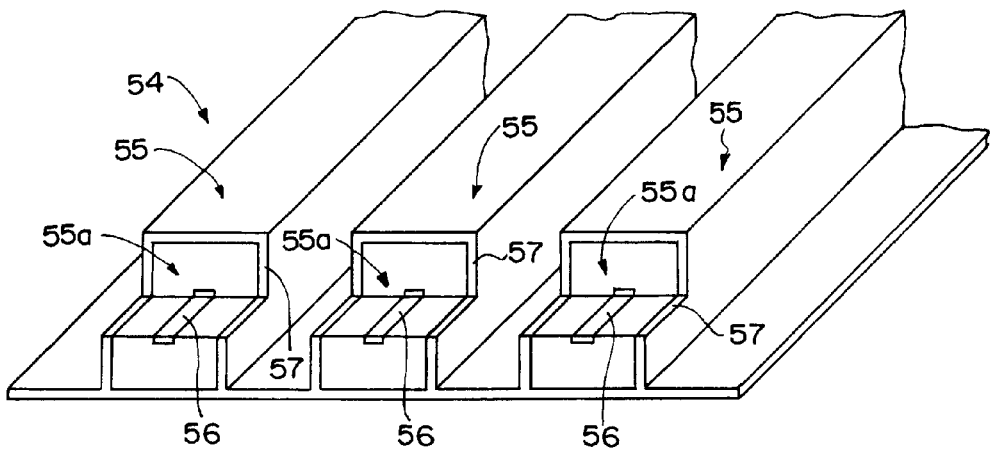
FIG. 30B is a view for explaining a method of connecting the coaxial cable to the coaxial line formed in the substrate.
Figure 30C:
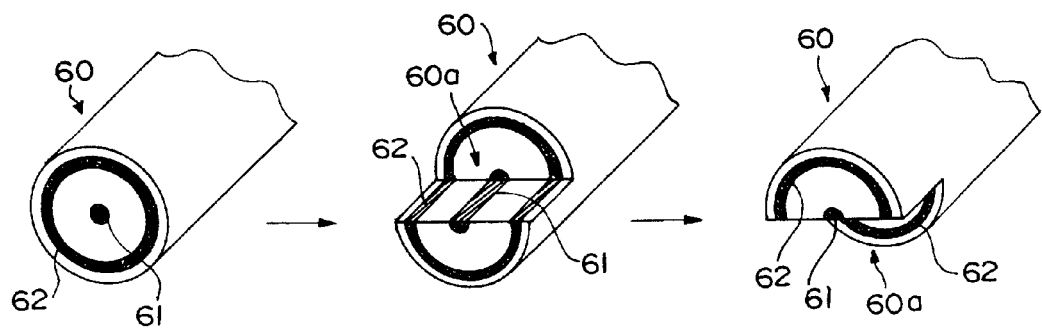
FIG. 30C is a view for explaining a method of connecting the coaxial cable to the coaxial line formed in the substrate.

Further, in the case where a substrate 54 in which a plurality of coaxial lines 55 as shown in FIG. 30A are formed in parallel is produced and the coaxial lines 55 are connected to the coaxial cables by way of the method as shown in the above-mentioned preferred embodiment, it is possible to:

firstly, form a cut-off portion 55a so that signal lines 56 and ground electrodes 57 may be exposed upwards at portions connected the coaxial cables, i.e., tip portions of the respective coaxial lines 55 in the substrate 54, as shown in FIG. 30B; and while, form a cut-off portion 60a so that signal lines 61 and ground electrodes 62 may be exposed to upper surfaces at portions connected to the coaxial lines 55 in coaxial cables 60, i.e., tip portions of the coaxial cables 60, as shown in FIG. 30C.

Figure 31A:
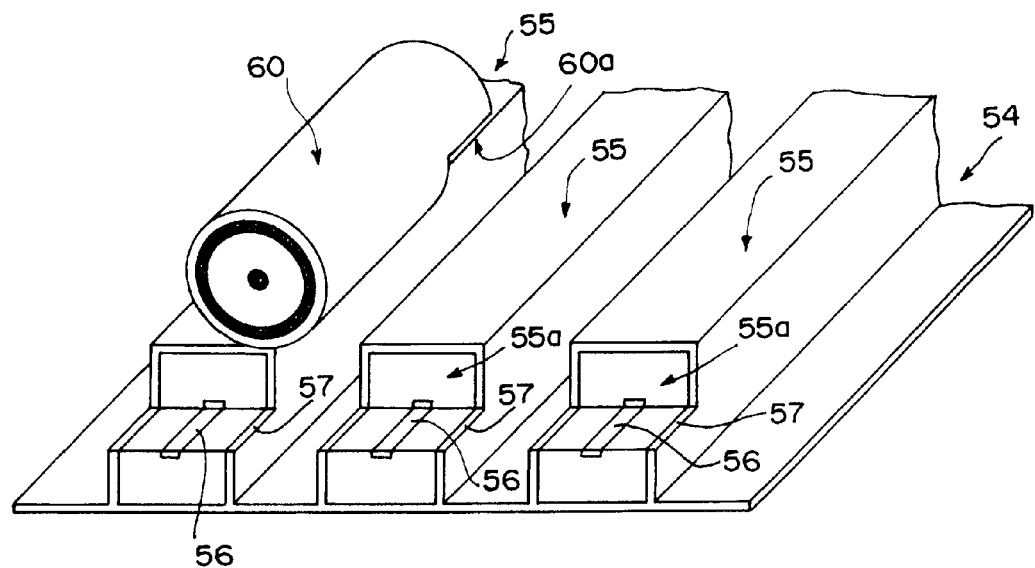
FIG. 31A is a view for explaining a method of connecting the coaxial cable to the coaxial line formed in the substrate.
Figure 31B:
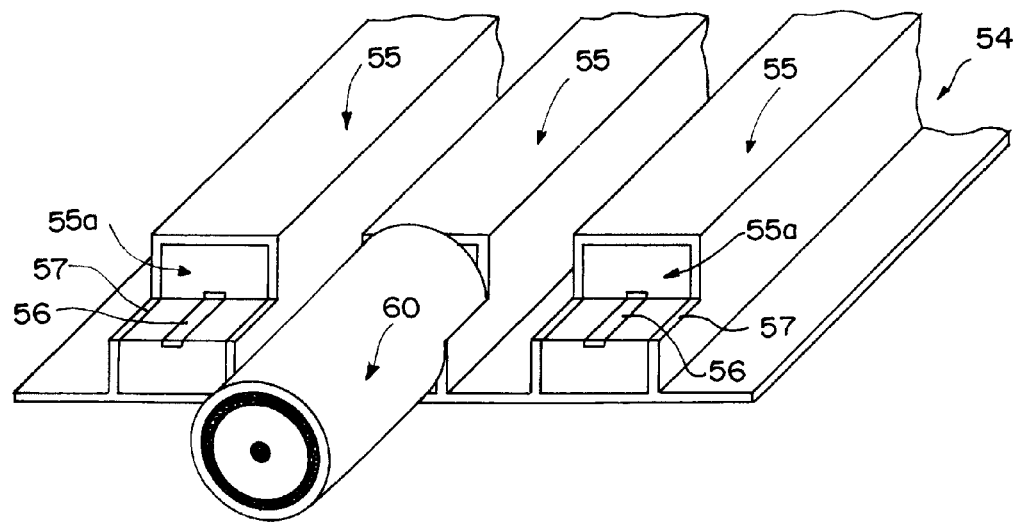
FIG. 31B is a view for explaining a method of connecting the coaxial cable to the coaxial line formed in the substrate.

As shown in FIG. 31A, the cut-off portion 55a of the coaxial line 55 in the substrate 54 and the cut-off portion 60a of the coaxial cable 60 are caused to face each other and further joined together in a situation where the respective signal lines and ground electrodes are in electrical contact with each other as shown in FIG. 31B.

In addition, joining the coaxial line 55 with the coaxial cable 60 is realized such that both the metal portion of the coaxial line 55 and the metal portion of the coaxial cable 60 to be joined together are prepared for soldering in advance, and the joining portions are brought into contact with each other, and then generally heated.

According to such a joining method, since the connection in which the coaxial structure is substantially maintained is available, it is possible to reduce the degradation of the transmission characteristic of the connection part.

Figure 31C:
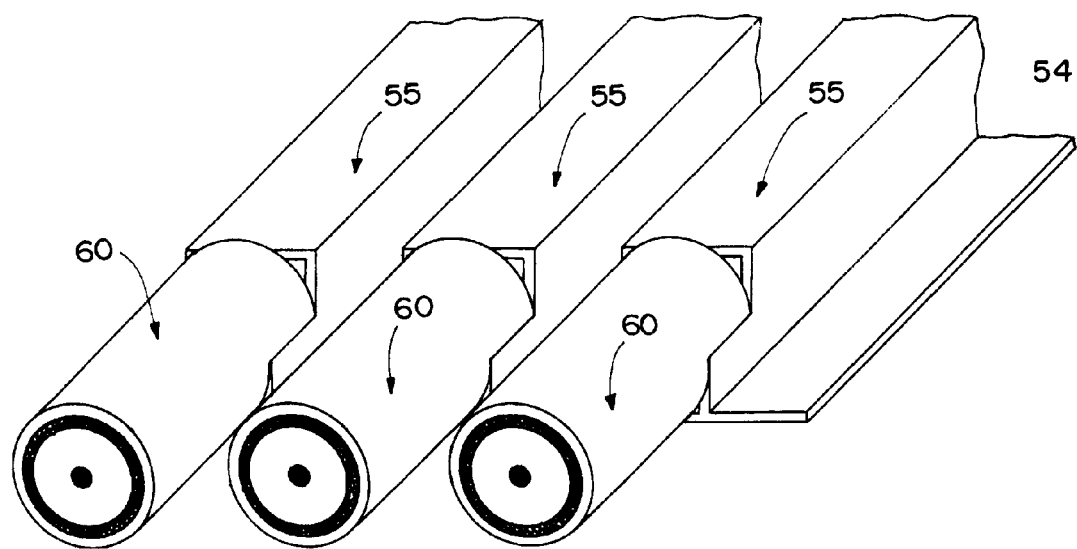
FIG. 31C is a view for explaining a method of connecting the coaxial cable to the coaxial line formed in the substrate.

Further, by the above-mentioned joining method, as shown in FIG. 31C, it is possible to connect the plurality of coaxial cables 60 with the plurality of coaxial lines 55.

INDUSTRIAL APPLICABILITY

The contact probe in accordance with the present invention can be used for measuring and evaluating the high speed and high frequency characteristic in the semiconductor integrated circuit, the package for the semiconductor integrated circuit, the printed circuit board, etc.

The invention claimed is:

1. A method of making a contact probe used for measuring and evaluating a high speed and high frequency characteristic of a measuring object, said method comprising:
   a step of making a first printed wiring board having a signal electrode and a ground electrode used as a contact part of the contact probe with respect to the measuring object, in which the signal electrode and the ground electrode are formed of a metal wiring pattern;
   a step of making a second printed wiring board, separate from the first printed wiring board, with a coaxial line structure having a shield electrode which encloses a signal line and the surroundings of said signal line through an insulating layer; and
   a step of electrically connecting the signal line of said second printed wiring board to the signal electrode of said first printed wiring board, and electrically connecting the shield electrode of said second printed wiring board to the ground electrode of said first printed wiring board.

2. The method of making the contact probe as claimed in claim 1, wherein a plurality of groups of signal electrodes and ground electrode are formed in said first printed wiring board and the corresponding groups of signal lines and shield electrodes are formed in said second printed wiring board,
   the signal electrodes of said first printed wiring board and the signal lines of said second printed wiring board are electrically connected together for each corresponding group, and the ground electrodes of said first printed wiring board and the shield electrodes of said second printed wiring board are electrically connected together for each corresponding group.

3. The method of making the contact probe as claimed in claim 1, wherein the step of making said first printed wiring board further comprises:
   a step of laminating a thin-film metal layer on a substrate made of silicon or glass;
   a step of laminating an insulating layer on said metal layer;
   a step of forming a photoresist pattern for forming the signal electrode and the ground electrode on said insulating layer;
   a step of laminating a metal layer on the insulating layer on which said photoresist pattern is formed; and
   a step of removing said photoresist pattern and forming the signal electrode and the ground electrode by the metal layer laminated on said insulating layer.

4. The method of making the contact probe as claimed in claim 3, further comprising using a prepreg including any of polyimide resin, BCB resin, polyamide resin, polyoxazole resin, epoxy resin, Teflon (registered trademark) resin, and cycloolefin resin for said insulating layer.

5. The method of making the contact probe as claimed in claim 3, wherein said metal layer is formed of either gold, silver, or copper.

6. The method of making the contact probe as claimed in claim 1, wherein the step of making said first printed wiring board further comprises:
   a step of laminating a thin-film metal layer on a substrate made of silicon or glass;
   a step of laminating an insulating layer on said metal layer;
   a step of laminating a metal layer on said insulating layer; and
   a step of forming a metal wiring pattern to be the signal electrode and the ground electrode on an uppermost metal layer by etching.

7. The method of making the contact probe as claimed in claim 6, further comprising using a prepreg including any of polyimide resin, BCB resin, polyamide resin, polyoxazole resin, epoxy resin, Teflon (registered trademark) resin, and cycloolefin resin for said insulating layer.

8. The method of making the contact probe as claimed in claim 6, wherein said metal layer is formed of either gold, silver, or copper.

9. The method of making the contact probe as claimed in claim 1, wherein the step of making said first printed wiring board further comprises a step of forming, by etching, a metal wiring pattern to be the signal electrode and the ground electrode on the metal layer of either upper or lower side of the insulating layer whose both sides are joined with thin-film metal layers.

10. The method of making the contact probe as claimed in claim 9, further comprising using a prepreg including any of polyimide resin, BCB resin, polyamide resin, polyoxazole resin, epoxy resin, Teflon (registered trademark) resin, and cycloolefin resin for said insulating layer.

11. The method of making the contact probe as claimed in claim 9, wherein said metal layer is formed of either gold, silver, or copper.

12. A method of making the contact probe used for measuring and evaluating a high speed and high frequency characteristic of a measuring object, said method comprising:
   a step of making a first printed wiring board having a signal electrode and a ground electrode used as a contact part of the contact probe with respect to the measuring object, in which the signal electrode and the ground electrode are formed of a metal wiring pattern, and making a second printed wiring board with a coaxial line structure having a shield electrode which encloses a signal line and the surroundings of said signal line through an insulating layer, and a step of electrically connecting the signal line of said second printed wiring board to the signal electrode of said first printed wiring board, and electrically connecting the shield electrode of said second printed wiring board to the ground electrode of said first printed wiring board, wherein the step of making said second printed wiring board further comprises:

a step of laminating an insulated side of an insulating layer whose one side is joined with a metal layer, onto a metal layer of either upper or lower side of an insulating layer whose both sides are joined with a thin-film metal layer;

a step of forming a metal wiring pattern to be the signal line and the ground line at an uppermost metal layer by etching;

a step of laminating an insulating side of the insulating layer whose one side is joined with a metal layer, onto a side where said metal wiring pattern is formed;

a step of carrying out a grooving process, respectively on both sides of said signal line along an extended direction of said signal line, towards a lower part from an upper part, intersecting said ground line, and reaching a metal layer lower than said signal line;

a step of subjecting, at least, a portion subjected to said grooving process to a metal plating process to form the shield electrode which encloses the surroundings of said signal line through the insulating layer; and a step of performing a cutting process so that a predetermined area of either upper or lower sides of said signal line and ground line may be exposed respectively.

13. The method of making the contact probe as claimed in claim 12, further comprising using a prepreg including any of polyimide resin, BCB resin, polyamide resin, polyoxazole resin, epoxy resin, Teflon (registered trademark) resin, and cycloolefin resin for said insulating layer.

14. The method of making the contact probe as claimed in claim 12, wherein said metal layer is formed of either gold, silver, or copper.

15. The method of making the contact probe as claimed in claim 12, wherein metal plating carried out for the portion subjected to said grooving process is copper plating.

* * * * *